(12) United States Patent
Zhang et al.

(10) Patent No.: US 11,909,367 B2
(45) Date of Patent: Feb. 20, 2024

(54) BROADBAND FILTER

(71) Applicants: The Thinking Pod Innovations Ltd, Nottingham (GB); THE UNIVERSITY OF NOTTINGHAM, Nottingham (GB)

(72) Inventors: Zhe Zhang, Nottingham (GB); Jordi Espina, Nottingham (GB); Mark Johnson, Nottingham (GB)

(73) Assignees: The Thinking Pod Innovations Ltd, Nottingham (GB); The University of Nottingham, Nottingham (GB)

( * ) Notice: Subject to any disclaimer, the term of this patent is extended or adjusted under 35 U.S.C. 154(b) by 185 days.

(21) Appl. No.: 17/608,724

(22) PCT Filed: May 4, 2020

(86) PCT No.: PCT/IB2020/054227
§ 371 (c)(1),
(2) Date: Nov. 3, 2021

(87) PCT Pub. No.: WO2020/225718
PCT Pub. Date: Nov. 12, 2020

(65) Prior Publication Data
US 2022/0287210 A1 Sep. 8, 2022

(30) Foreign Application Priority Data

May 3, 2019 (GB) ..................... 1906324
May 30, 2019 (GB) .................. 19177506

(51) Int. Cl.
*H03H 1/00* (2006.01)
*H03H 7/01* (2006.01)

(52) U.S. Cl.
CPC ........ *H03H 1/0007* (2013.01); *H03H 7/0115* (2013.01); *H03H 2001/0021* (2013.01)

(58) Field of Classification Search
CPC ..................... H03H 1/0007; H03H 7/0115
(Continued)

(56) References Cited

U.S. PATENT DOCUMENTS

2003/0227355 A1 12/2003 Lindenberger
2015/0229288 A1 8/2015 Kisner

FOREIGN PATENT DOCUMENTS

CN 207490880 U 6/2018

OTHER PUBLICATIONS

International Search Report and Written Opinion in PCT/IB2020/054227, dated Sep. 4, 2020.

*Primary Examiner* — Rakesh B Patel
(74) *Attorney, Agent, or Firm* — Sheppard Mullin Richter & Hampton LLP

(57) ABSTRACT

The present disclosure relates to a broadband filter for confining or attenuating electromagnetic interference noise from one or more electrical signal sources, In an embodiment, the broadband filter comprises one or more filter stages electrically coupled by galvanic or by electromagnetic means to the one or more electrical signal sources for confining or attenuating conducted electromagnetic interference noise; one or more conductive shields electrically coupled by galvanic or by electromagnetic means to the electrical signal sources wherein the shields encapsulate the filter stages for confining or attenuating conducted and/or radiated electromagnetic interference noise; and one or more conductive partition layers to encapsulate the one or more filter stages such that the partition layers electromagnetically couple adjacent filter stages for a selected frequency range of the electromagnetic interference noise. The thickness of the conductive partition layers is chosen to control the degree of coupling.

20 Claims, 25 Drawing Sheets

(58) Field of Classification Search
USPC .......................................... 333/175, 181, 185
See application file for complete search history.

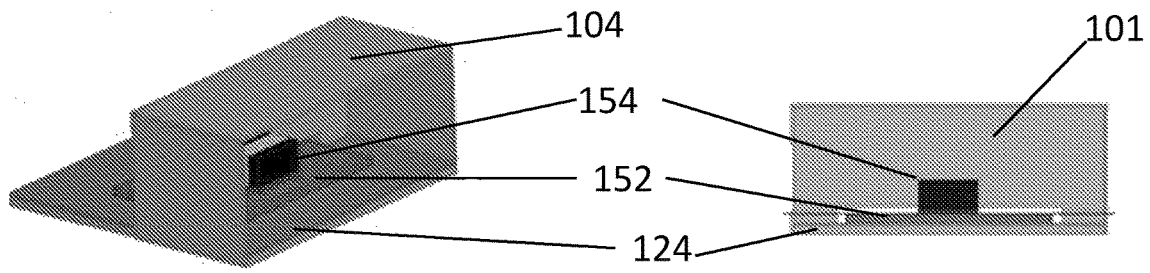
Figure 11a
Figure 11b
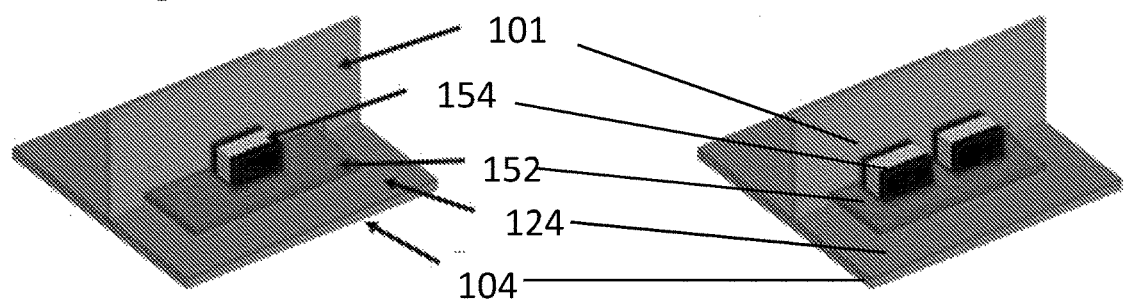
Figure 11c
Figure 11d
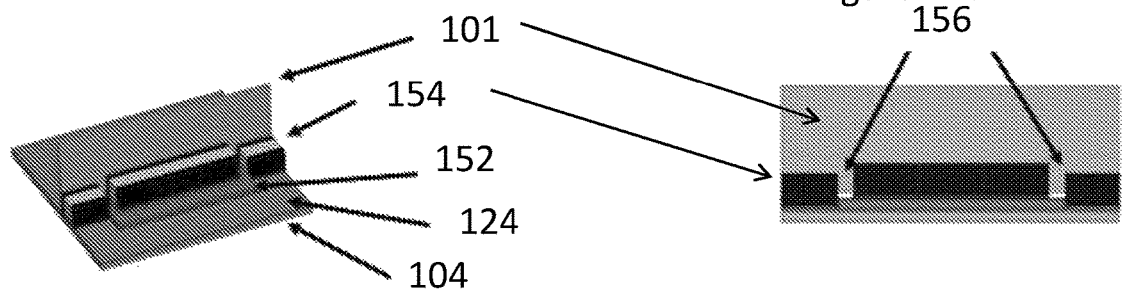
Figure 11e
Figure 11f
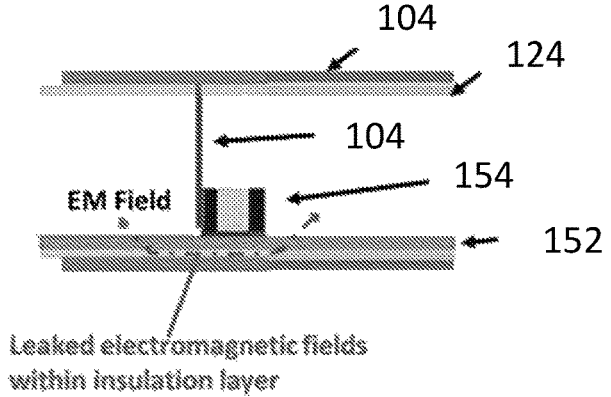
Figure 12

Side view

Soldered into power trace

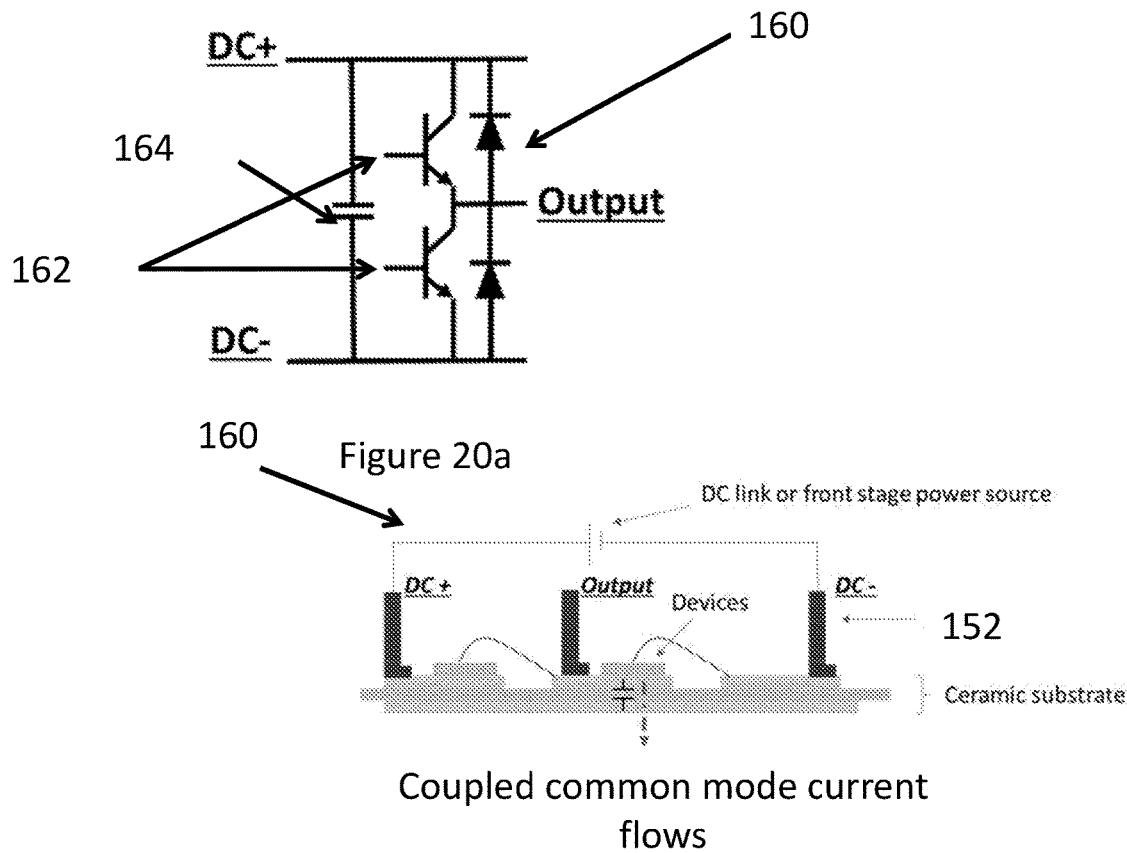
Figure 20a
Coupled common mode current flows
Figure 20b
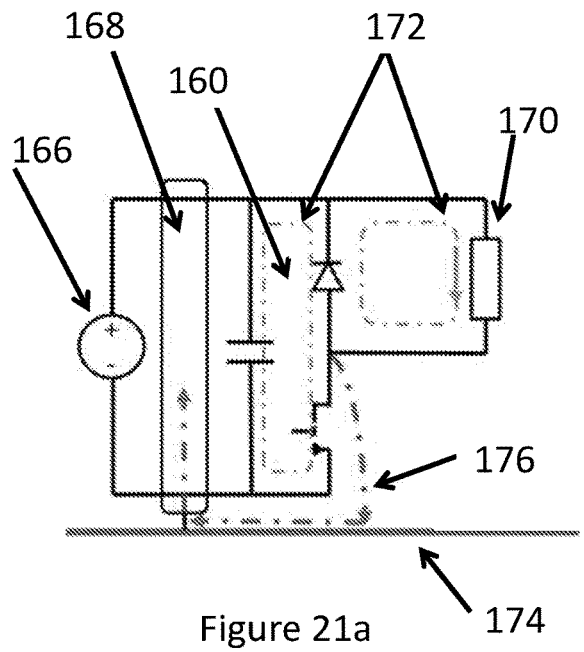
Figure 21a
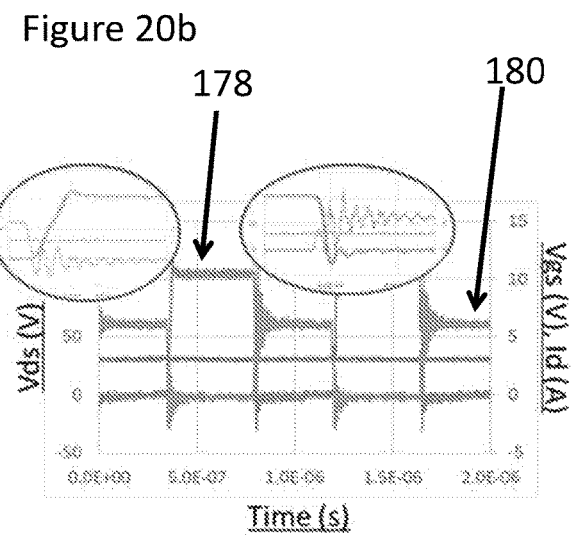
Figure 21b

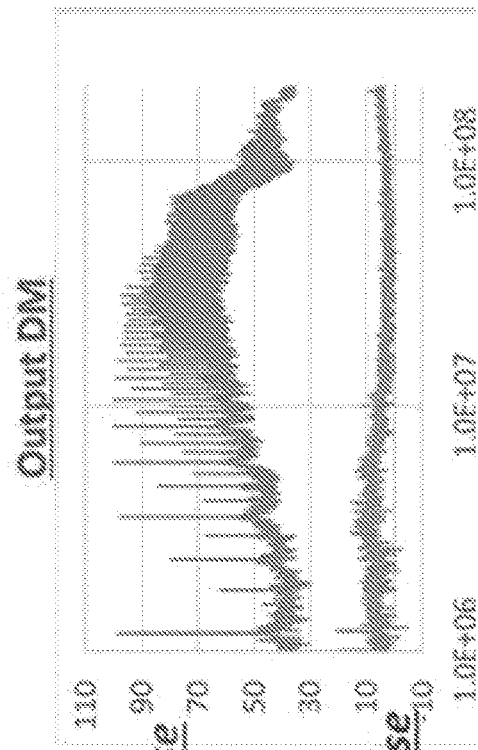
Figure 23a
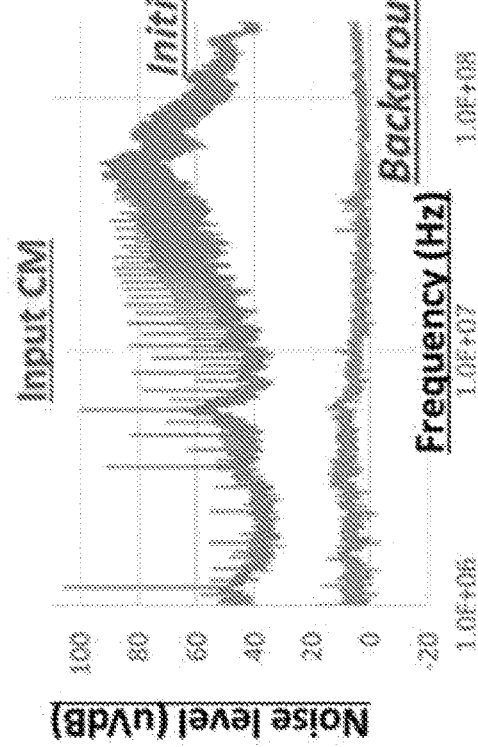
Figure 23c
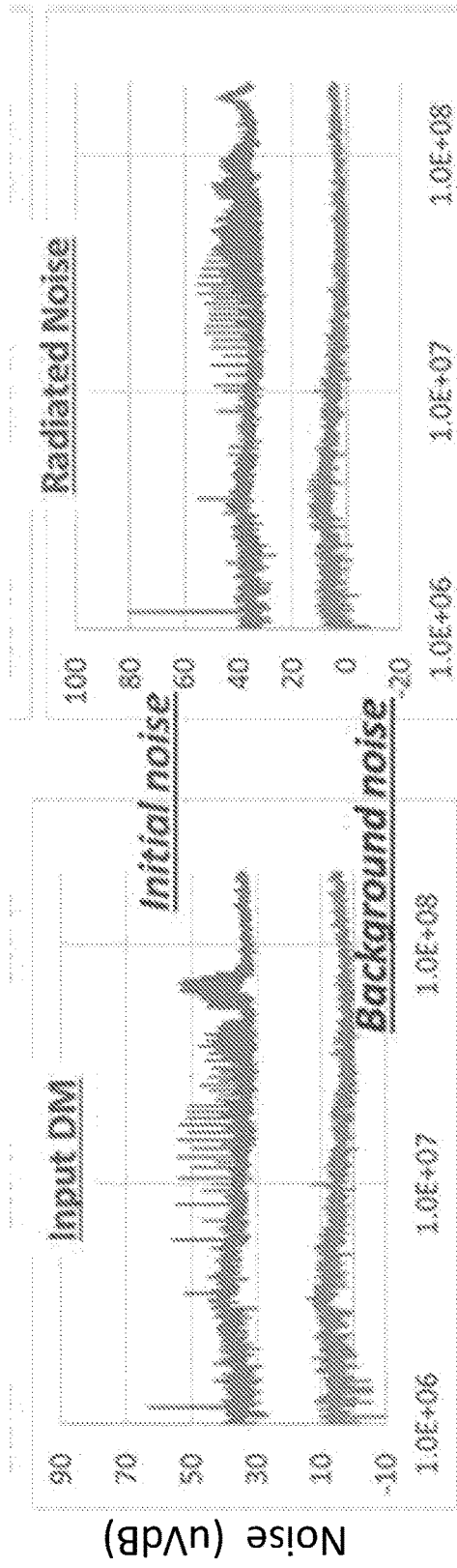
Figure 23b
Figure 23d

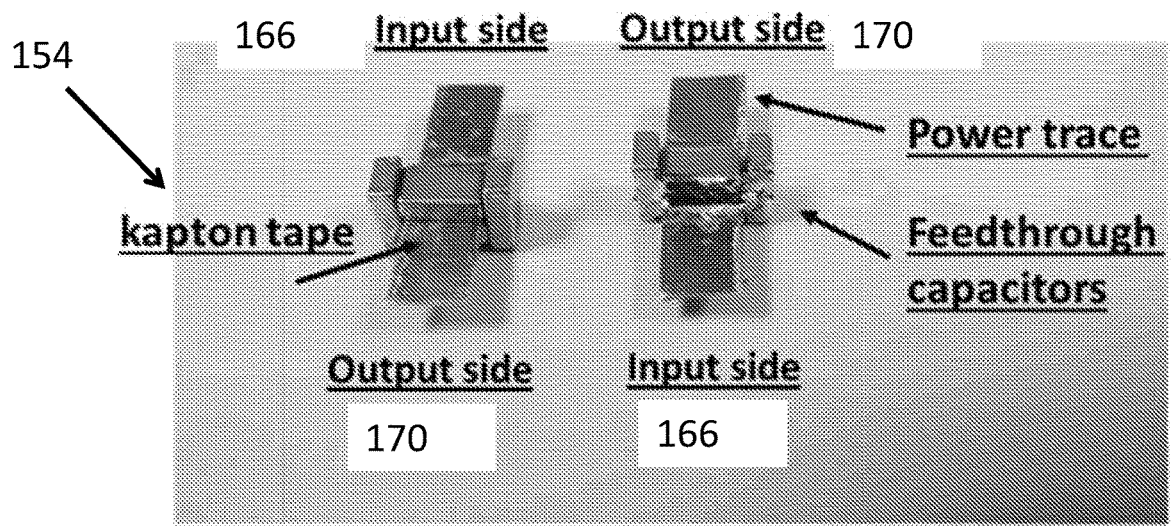
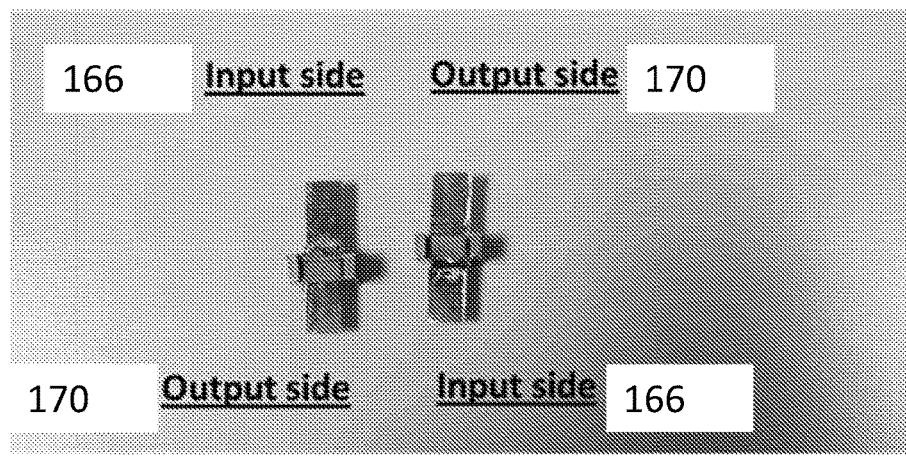
Figure 27
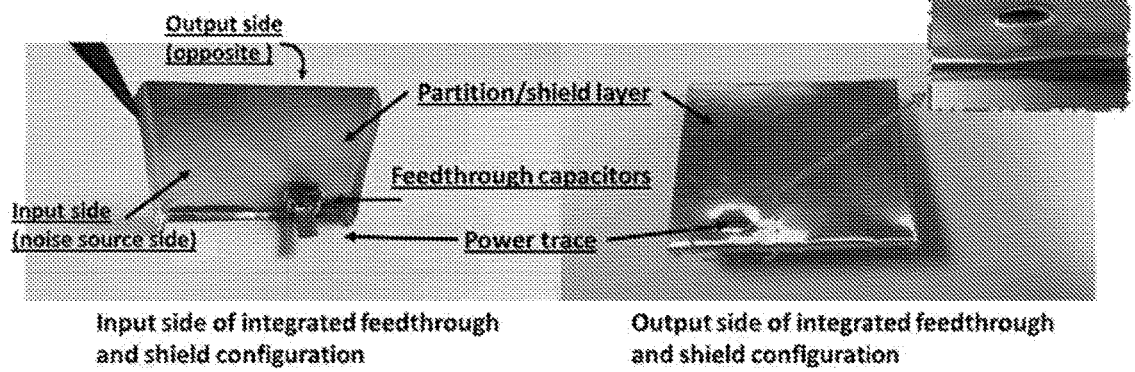
Figure 28          Figure 29

BROADBAND FILTER

FIELD OF INVENTION

The current invention relates to a broadband filter. In particular to a broadband filter for confining or attenuating electromagnetic interference noise from an electrical signal source, such as an electrical switching device or any other electrical device capable of delivering an electrical signal.

BACKGROUND OF THE INVENTION

Confinement of electromagnetic interference (EMI) over a broad frequency range is highly desirable, especially if devices such as switched-mode power converters (e.g. dc-dc converters or inverters) are to realise the full potential of wide bandgap devices. EMI arises from the rapid voltage and current transitions occurring during operation of a switching cell within electrical devices, typically power converters. Broadband filters, typically a series of low pass filters, are usually employed to achieve high noise attenuation and wide stop-band filter characteristics; and whose configuration and cut-off frequency is chosen to achieve the required level of attenuation over the stop-band.

However, conventional filter components are not ideal and their characteristics deviate from those of the theoretical components that they are made from. At frequencies below several MHz, conventional, passive EMI filters typically provide enough noise attenuation. However, at higher frequencies filter performance is compromised by parasitic inductance and capacitance within the filter system and by mutual electromagnetic coupling between filter stages. Indeed, for frequencies above, say, 10 MHz, it is very easy for EMI noise to couple from the source side of a filter directly to the load side without passing through each filter stage.

The conventional approach to tackling EMI noise is to use external EMI control measures, for example, by applying passive filters to attenuate EMI noise outside the switching cell. However, the desire for higher switching speeds, with a resulting electromagnetic signature extending to higher frequencies, will drive a move towards physically smaller commutation cells with controlled circuit parasitics and a requirement to suppress and contain EMI close to the switching noise source.

The present invention aims to provide a new approach to EMI suppression by combining a series of measures which together confine EMI to a closed volume surrounding the noise source. This is done by providing a broadband filter to confine or attenuate electromagnetic interference noise from electrical signal sources, such as electrical switching devices.

SUMMARY OF THE INVENTION

According to the present invention, there is provided a broadband filter for confining or attenuating electromagnetic interference noise from one or more electrical signal sources, said broadband filter comprising: one or more filter stages electrically coupled by galvanic or by electromagnetic means to one or more electrical signal sources for confining or attenuating conducted electromagnetic interference noise; one or more conductive shields electrically coupled to the electrical signal source, wherein the shield encapsulate the filter stages for confining or attenuating conducted and/or radiated electromagnetic interference noise; and one or more conductive partition layers to encapsulate the one or more filter stages such that the partition layers electromagnetically couple adjacent filter stages for a selected frequency range of the electromagnetic interference noise, and wherein the thickness of the conductive partition layers is chosen to control the degree of coupling.

This arrangement combines two techniques for confining and attenuating electromagnetic (EM) noise—the filter stages act to both confine and isolate EM noise arising from conducted pathways, whilst the shield layers confine and isolate radiated EM noise. By encapsulating the filter stages with the shield layers the broadband filter effectively blocks a higher amount of EM noise than conventional approaches.

In this way, the highest noise frequency components may be returned to the source via the shortest path. This may allow the frequency of EM confinement within the filter stages to be varied to provide frequency-selective EM confinement of or within the filter stages.

Here, encapsulates means at least substantially, typically completely, enclosing the filter stages (and later the electrical switching devices) with the shields (barring necessary gaps for feedthroughs and electrical isolation). Furthermore as will be appreciated, the EM noise typically comprises both conductive and radiative noise.

By electromagnetic interference noise, it is intended to cover traditional noise inherent with electrical signal sources that are undesired from either an input signal or to restrict said inherent noise from electrical signal sources to within the broadband filter. Additionally or alternatively a further application of this type of broadband filter is the confinement of electromagnetic interference generated by switched-mode power converters, for example dc-dc converters or inverters. Electromagnetic interference arises from the rapid voltage and current transitions occurring during operation of the switching cell within power converter. Accordingly, EM noise is intended to mean any electromagnetic interference that is not part of the desired input/output signal from/to an electrical device and covers interference noise that is fundamental to the operation of the electrical signal source. For example, as noted above, if the electrical signal source is a switching or power converter, such as a GaN switching device, then fundamental operation of such a switching device (switching behaviour and action of filter components as part of the energy storage and transfer mechanism) can lead to electromagnetic disturbances. These disturbances may not be considered 'noise' in a strict power electronic sense, but they can be undesirable in some applications and the use of the term electromagnetic interference noise in the present disclosure is intended to cover such disturbances, as well as traditional electromagnetic noise of the type described above and below.

In some embodiments the one or more conductive shields further encapsulate the one or more electrical signal sources; and/or the conductive shields are electrically coupled by galvanic or by electromagnetic means; and/or the one or more electrical noise sources are galvanically isolated, for example the input and output of a power converter. In such cases one or more shields may be employed, each being galvanically isolated from the others but coupled via electromagnetic means, for example using a suitable capacitor or by overlapping of the shields. This acts to reduce radiative and conductive noise from the electrical signal source.

In another embodiment, the filter stages further comprise filter components, such as one or more inductors and/or one or more capacitors, to filter a broadband of frequencies. However, it may be appreciated that filters can also utilise resistive elements to form the desired filtering instead of (or in addition to) inductors and capacitors. The filter stages} may also comprise one or more additional conductive partition layers placed between and/or around the one or more filter components to electromagnetically couple said filter components for a selected frequency range of electromagnetic interference noise.

In some embodiments, the thickness of the conductive partition layers is progressively increased the further away it is from the one or more electrical signal sources, such that the conductive partition layer attenuating or reflecting electromagnetic interference noise with the highest frequency is located closest to the electrical signal source. In this way, the highest noise frequency components may be returned to the source via the shortest path. This may allow the frequency of EM confinement within the filter stages to be varied to provide frequency-selective EM confinement of or within the filter stages.

Thus, according to another embodiment of the present disclosure the shields and the partition layers may be electrically connected by using vias, or via metallic pillars, or by direct soldering of the shield and the partition layers, such that the combination of partitions and shields encapsulate each filter stage.

In a further complementary or alternative embodiment, a higher-frequency filter stage may be encapsulated within a lower-frequency filter stage. As noted above, encapsulate is intended to mean at least substantially, typically completely, enclosing the filter stages, and in this instance the one or more filter stages are encapsulated as a whole by the shields, with each filter stage encapsulated or cocooned by a combination of one or more partition layers and one or more shields. Soldering is intended to include traditional soldering means, as well as any equivalent method that provides an electrically conductive bond between the shield and the associated conductive partition layers, such as via conventional electrical connections on a circuit board or the like, or via direct electrical connections It can be further or alternatively appreciated that in embodiments the shields and the conductive partition layers may be electromagnetically coupled partly or substantially through an air-cored configuration. By air-cored configuration it is intended to mean that components do not depend upon a ferromagnetic material to achieve a required inductance. It can be appreciated that in such embodiments magnetic and/or dielectric materials may be used in the coupling path.

This embodiment may provide complete partitioning of adjacent filter stages, which minimises the number of openings between each filter stages. In this way, radiated high frequency noise may be reflected back into the filter stage from the shield/partition layers and conducted high frequency noise may then be encouraged to flow on the inside of the shield and be returned back to the noise source via the partition layers.

In another embodiment, each filter stage has a different cut-off frequency for confining or attenuating the conducted electromagnetic interference noise at a different cut-off frequency. Such cascaded filter arrangement allows high noise attenuation to be achieved continuously over a wide range of frequencies, with each filter stage tailored to attenuate noise at a particular range of frequencies.

In such an arrangement, an anti-resonant frequency of a filter stage having a lower cut-off (resonant) frequency may be substantially aligned with a resonant frequency of an adjacent filter stage having a higher cut-off frequency. In each filter stage, noise attenuation may be degraded after the anti-resonant frequency of the filter stage due to parasitic elements. Accordingly, the next highest cut-off (higher frequency filter stage) may then take over the attenuating role from the previous filter stage (lower frequency filter stage) to achieve the necessary (fastest) roll-off rate and to yield an extended stop-band.

If an anti-resonant point of the lower frequency filter stage is well below the cut-off point of the higher frequency filter stage, the overall noise attenuation may deteriorate above the first anti-resonant point. Conversely, if the higher frequency cut-off is well below the lower frequency anti-resonant frequency and very close to lower frequency filter stage cut-off, it could cause a faster and steeper roll-off frequency response after the higher-frequency cut-off. However, in this case, the higher values of inductance (L) and capacitance (C) required may generally result in a higher equivalent series inductance (ESL) and equivalent parallel capacitance (EPC) involved, and thus HF noise attenuation can become worse.

The partition layers may be considered to be closed partitions (such as EM reflecting structures) with feedthroughs for passing the electrical signal from one filter stage to the next. The partitions act to provide local EM confinement and to (as completely as possible) isolate EM noise produced by the electrical signal sources (e.g. the switching devices) from crossing into the electrical load side. A similar mechanism may also occur with the shields. Accordingly, noise coupled into the shield/partitions may be returned to the source rather than propagating to the load.

The filter stages may further comprise one or more additional conductive partition layers placed between and/or around the one or more filter components (i.e. the filter components within the filter stages) to control the degree of electromagnetic coupling between said filter components for a selected frequency range of electromagnetic interference noise.

As noted above the frequency range over which the partition layers provide local EM confinement may be selected according to the components and/or device expected noise frequency components.

In an embodiment, the thickness of the shields may also be such that they prevent propagation of electromagnetic interference noise corresponding to the filter stage with the lowest cut-off frequency. Accordingly, for high frequency filter stages, close to the electrical noise source, the partitions can be relatively thin (e.g. less than 1 mm for frequencies in excess of 1MHz) compared to subsequent stages. Thinner partitions reflect and attenuate higher frequency noise whilst allowing lower frequency signals to propagate without significant attenuation.

Accordingly, in one technique, to achieve best high-frequency (HF) performance the impedance of the return path may be minimised, and it can be appreciated that this becomes progressively more important at higher frequencies. It may thus be preferable to minimise the length and thus the impedance of all return paths and particularly those associated with the higher frequency components.

Filter stages with low cut-off frequency typically suffer from the effects of large parasitics, which limit the HF performance and thus a high level of HF noise will propagate to the next filter stage. So, if the low frequency cut-off stage is followed by a high frequency cut-off stage the high frequency return currents must flow through the return paths of both stages, yielding a relatively long return path. On the other hand if the high frequency cut-off filter stage is positioned closest to the electrical signal (noise) source, the high frequency return path will be minimised. The ordering of filter stages relative to the noise source thus becomes important if the highest levels of HF attenuation are to be achieved. Thus, each filter stage is designed to remove noise only over a band of frequencies where the combination of filter components and partitions can provide an effective and efficient mechanism for attenuation.

It can be appreciated that a significant amount of high frequency noise may still couple from the input/source to the output/load if gaps exist between the shields and the partition layers. It can be appreciated that the input/source may be a distinct (separate) input from an external source, such that the broadband filter acts as an in-line filter receiving an input from the external source and providing a (filtered) output. Therefore, it may be appreciated that the one or more filter stages may form an in-line filter for suppressing electromagnetic interference noise from an external electrical signal source. Alternatively the input/source may be an enclosed source where noise from the source can propagate through any electrical connection penetrating the enclosure (shield and partition layers), for example an input and output of a power electronic converter. It can further be appreciated that although described with reference to input/output of a power converter, control signals may also be sources of electrical noise and can be filtered using the broadband filter.

The filter stages may be electrically connected by an interconnecting conductor for carrying electrical signals through the filter stages for a specific range of frequencies. It can be appreciated that the filter stages may be connected electrically (gavanically) using the interconnecting conductor, electromagnetically by sharing magnetic and electric flux paths or by both methods at the same time. The same principles can be applied to individual magnetic and/or capacitive components where the shields and partition layers may be employed to control the degree of electromagnetic coupling between the components.

It can be appreciated that the voltage potential of the shields and the interconnecting conductor may differ by hundreds (or even thousands) of volts, for example in power electronic filtering applications. Thus, an insulating layer between the interconnecting conductor and shields may be used to electrically isolate the interconnecting conductor, and the interconnecting conductor may be further electrically isolated from the partition layers. This avoids insulation breakdown and partial discharge.

According to another embodiment, the thickness of the partition layers may be several times the skin depth of the lowest frequency electromagnetic interference noise, to attenuate eddy currents induced by the magnetic field of the electromagnetic interference noise.

In some embodiments, the shields and/or partitions layers may contain one or more apertures to allow electrical signals (as noted above, these electrical signals may include input/output signals from an enclosed or external power converter, or may additionally or alternatively include control signals) to pass through the shield and/or partition layers. These apertures can offer a route for HF noise to leak across the shield/partitions layers.

To mitigate the HF noise leakage, apertures in the shields and partitions may be surrounded by one or more capacitors deployed adjacent the apertures to substantially cover the apertures and prevent propagation of electromagnetic interference noise through the apertures in the shield and/or partition layers.

In some embodiments, these capacitors may form part of the capacitance of the filter stage. More specifically, the capacitors may be located within the shields and/or partition layers encapsulating the filter stage(s). The interconnecting conductor may be electrically connected to a first terminal of the capacitors; and the partition layers may be electrically connected to the other terminal of the capacitors. In this way, high frequency noise may be bypassed from the interconnecting conductor to the partition and/or shield layer.

The capacitors may contain multiple layers of metal in the capacitor structure, and metal end caps. This structure can provide a reflecting and/or absorbing capability for high frequency noise, such that it is returned back to the source rather than being allowed to propagate.

The first terminal of the capacitors may, in an embodiment, be electrically isolated from the partition layers and/or shield layers, and the second terminal of each capacitor may be electrically isolated from the interconnecting conductor.

Some electromagnetic noise can still propagate through the insulating layer between the interconnecting conductor and the shield, as there are no reflecting structures on the back side of the interconnecting conductor. For this reason, the interconnecting conductor may be encapsulated by a plurality of the capacitors forming a filtered feedthrough connection. In this way, substantially all the noise is blocked and reflected by the capacitors and the high frequency electromagnetic fields inside and outside the filter stages may be considered to be completely decoupled.

In one embodiment the capacitors may provide the filtered feedthrough connection through a printed circuit board. The printed circuit board may be integrated as part of a power converter. The filtered feedthrough may also comprise one or more interleaved conductor and ground planes to form a labyrinth structure (i.e. a tortuous path or series of overlapping structures) for attenuating radiated electromagnetic noise. The conductive inserts and/or conductive side walls of the conductive shield may then be electrically connected to the ground planes to form a continuous conductive shield around the labyrinth.

As noted above, the partition layers and/or the shield layers may direct and confine electromagnetic interference noise back to and local to the electrical signal source, away from an input/output signal of the electrical signal source.

In yet another embodiment, and as noted above, a nested configuration of the filter stages may be preferred. Here, the higher-frequency filter stage may be encapsulated within the lower-frequency filter stage. This means that the lower frequency components can penetrate the partition and couple with the low frequency stage inductor. A low-frequency flux return path that lies outside the high-frequency stage partition can make this coupling more effective, for example by using an appropriate magnetic material.

It can also be appreciated that the partition layers may be conductive and may also be magnetic. This can allow further attenuation of radiated noise. In such examples the partition layers and/or the shield layers may comprise a magnetic material for magnetically coupling the electromagnetic interference noise. Additionally, the filter stage may comprises an inductor, said inductor comprising magnetic material, and wherein the inductor is magnetically coupled to the electromagnetic interference noise. In general, electromagnetic coupling via magnetic means removes the need for galvanic connections. The filter stage and/or the shields and/or the partitions and/or an inductor in the filter stage may be thermally managed to dissipate heat generated to allow increased current density.

As noted above, the broadband filter may also have an air-cored configuration, wherein a higher-frequency filter stage is encapsulated within a lower-frequency filter stage. It can be appreciated that this may be complementary to the magnetic embodiments described above.

It can be appreciated that the embodiments described above are complementary and accordingly features described in relation to one embodiment may typically be implemented for an alternative embodiment. These and other aspects of the invention will be apparent from, and elucidated with reference to, the embodiments described hereinafter.

DETAILED DESCRIPTION OF THE DRAWINGS

Embodiments will be described, by way of example only, with reference to the drawings, in which FIG. 1 illustrates the use of low frequency (LF) and high frequency (HF) stages to attenuate noise at specific frequencies;

FIGS. 11a -11f shows capacitive arrangements for use with the broadband filter;

FIG. 12 shows the passage of the EM field in relation to a capacitor mounted between the interconnecting conductor and partition;

FIGS. 20a and 20b show exemplary switching cells;

FIGS. 23a-23d show initial EMI measurements;

Figure 30:
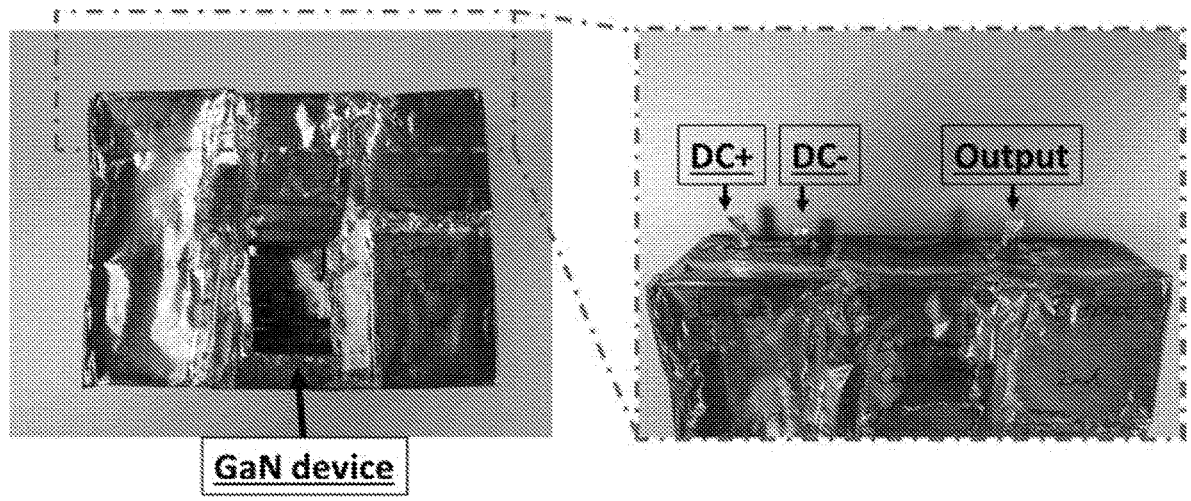
Figure 31:
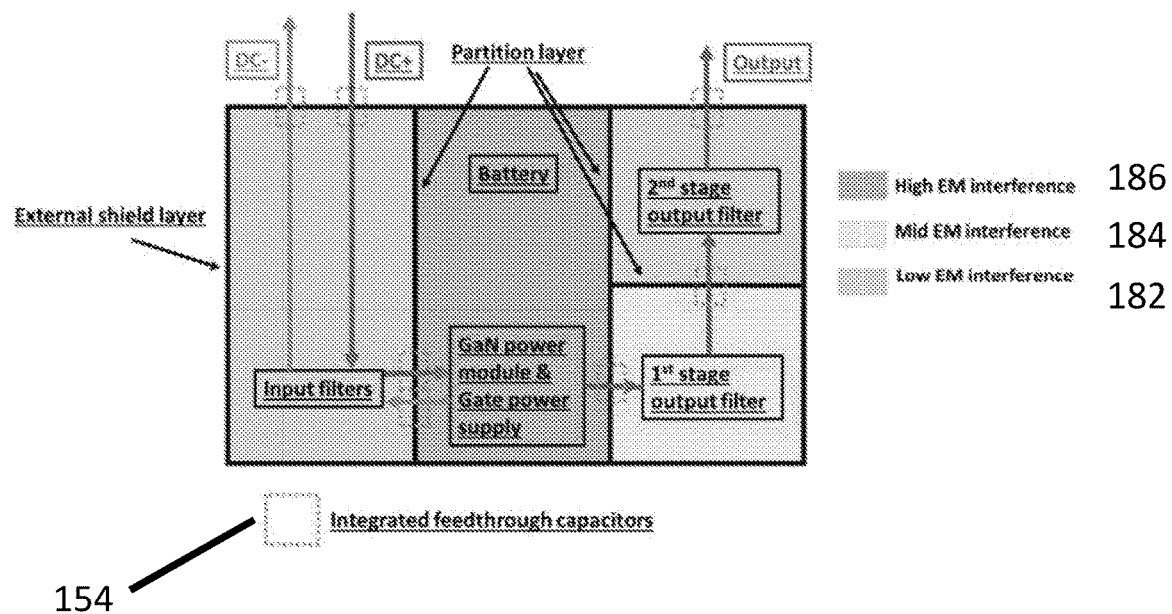

FIGS. 27a and b, each show capacitors forming a feedthrough according to an arrangement of a shield layer;

FIG. 28 shows the connection of capacitors of FIG. 27 forming a feedthrough between filter stages;

FIG. 29 shows a complete arrangement including capacitors and partition/shield layers FIG. 30 shows a GaN power converter with EMI interventions applied;

FIG. 31 shows functional schematic diagram of the finished GaN converter; and

Figure 32:
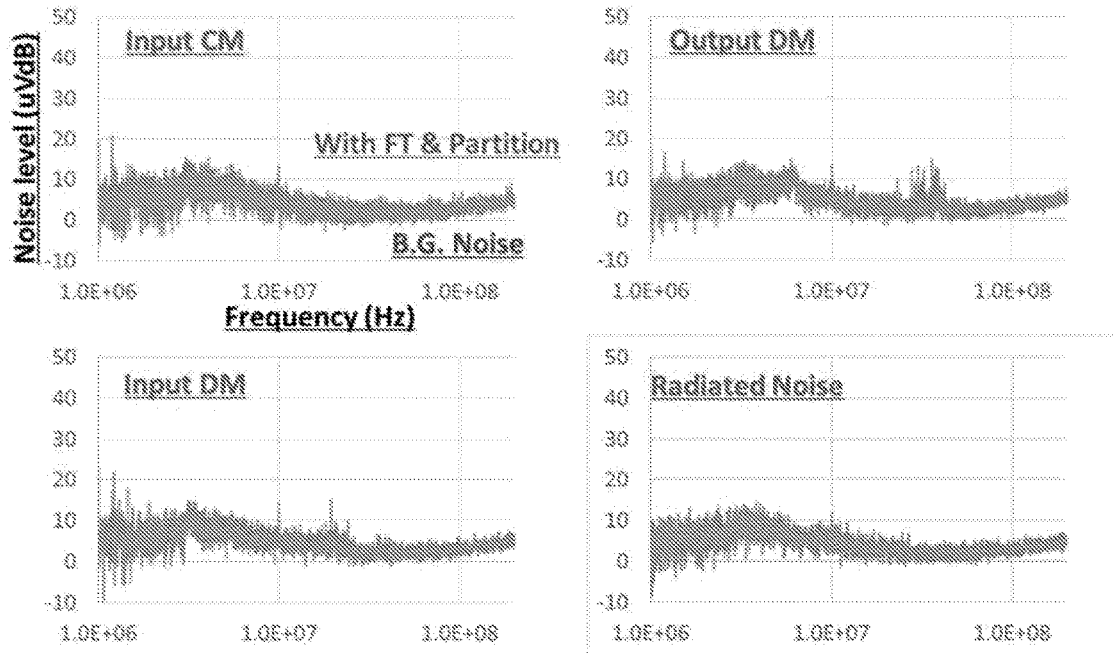
Figure 33:
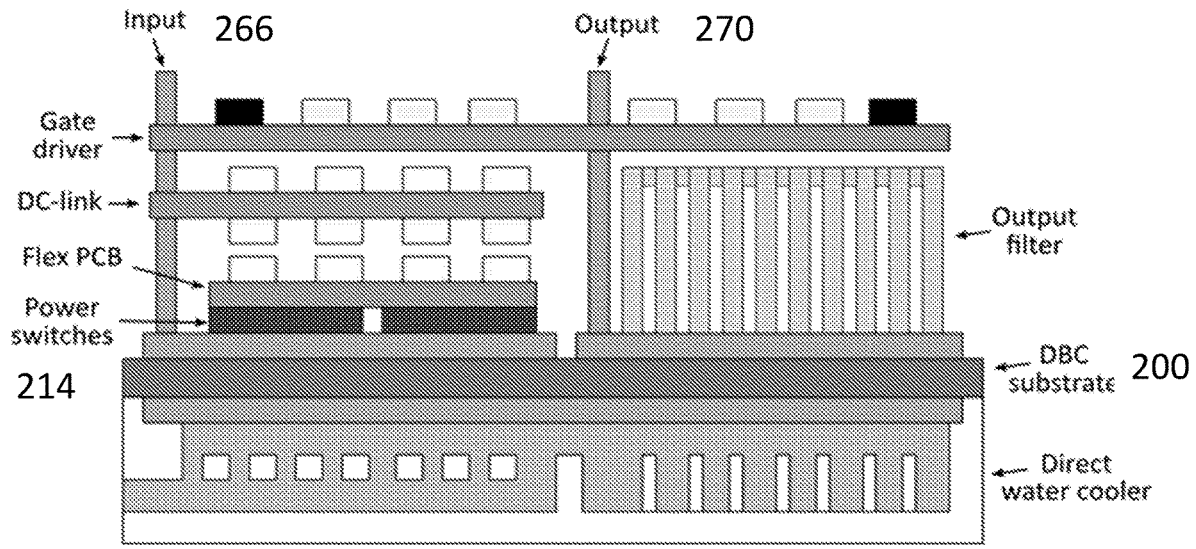
Figure 34A:
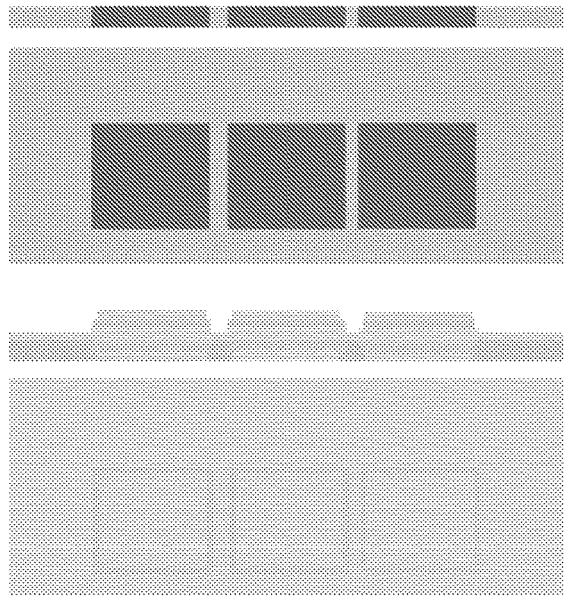
Figure 34B:
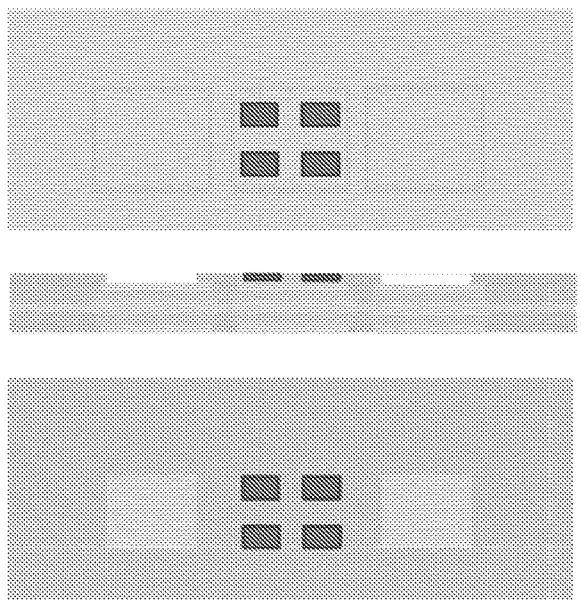
Figure 34C:
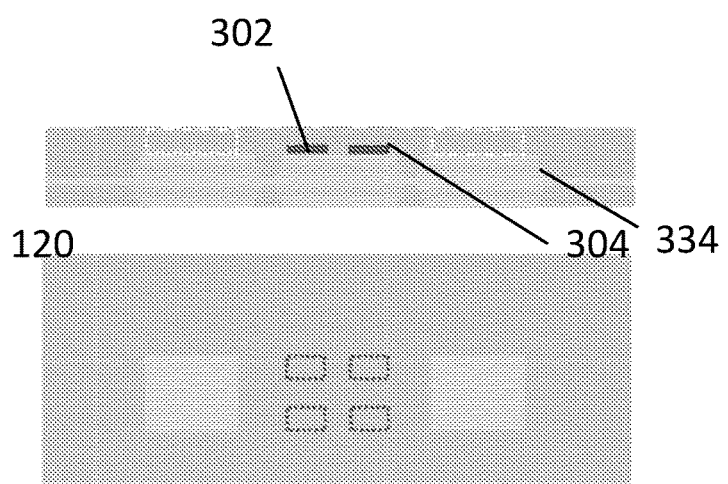
Figure 34D:
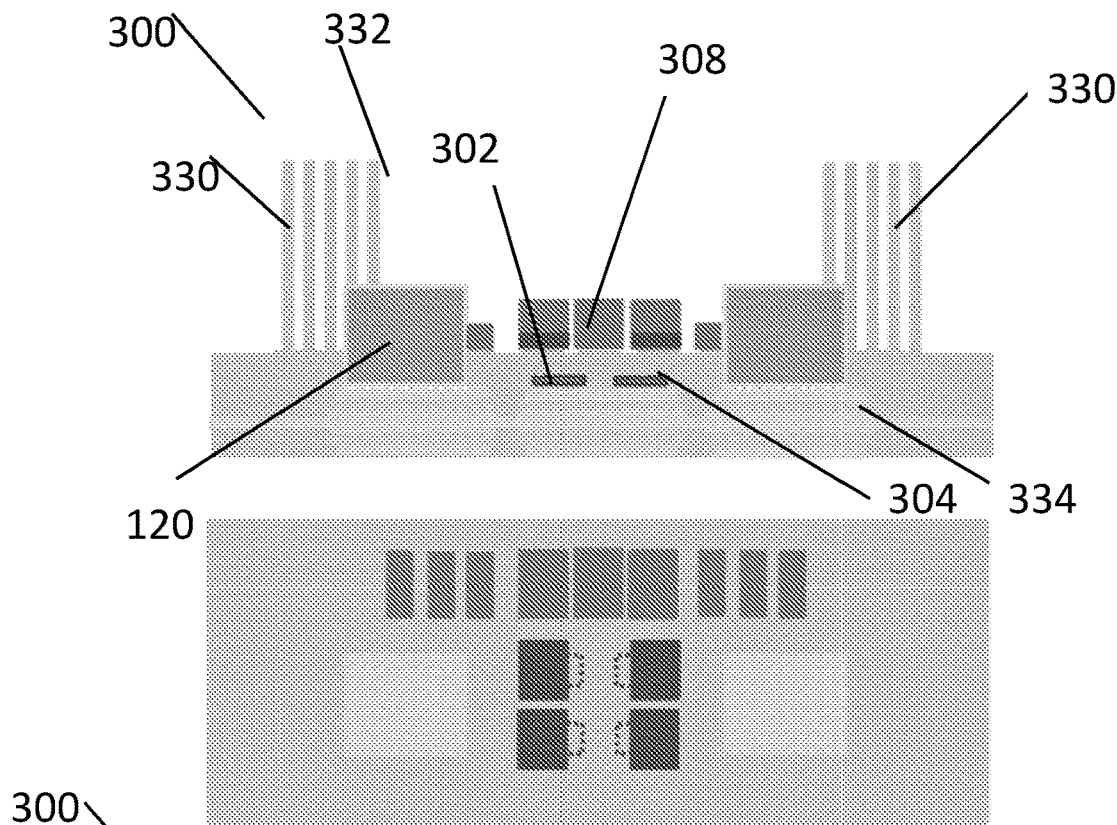
Figure 34E:
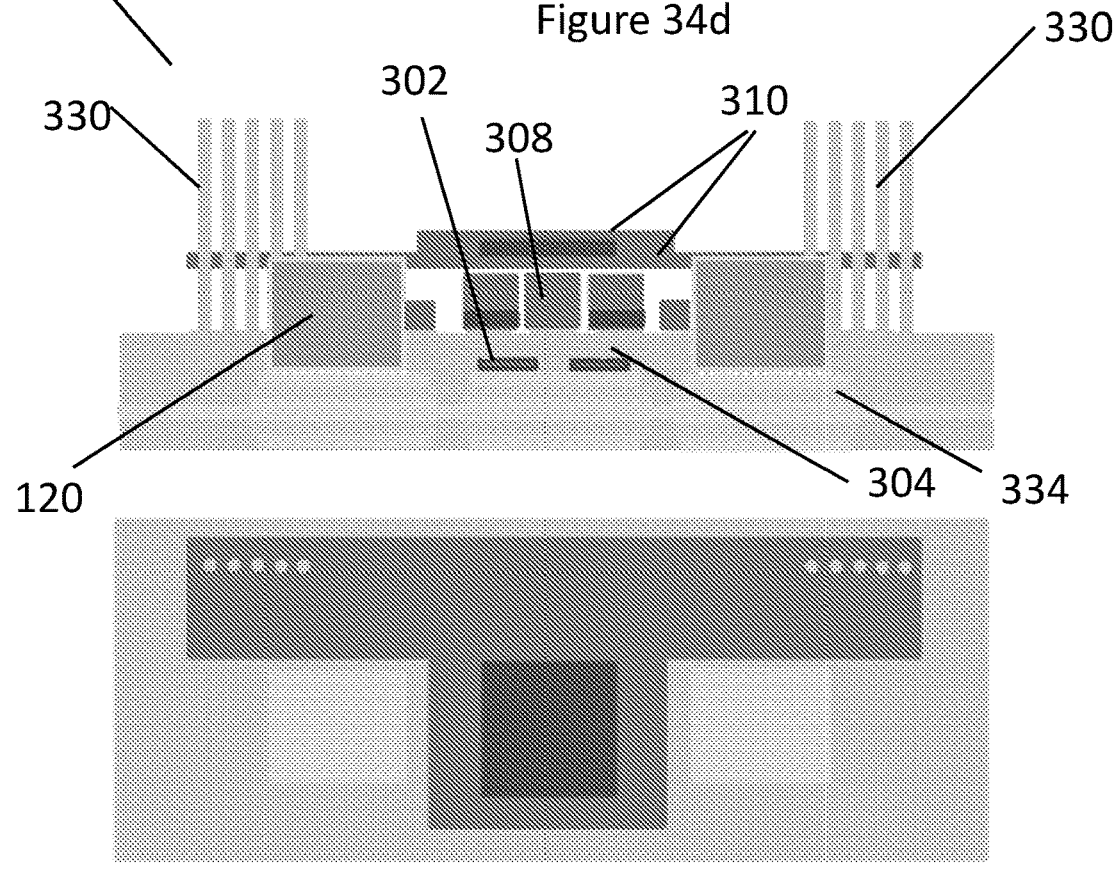
Figure 34F:
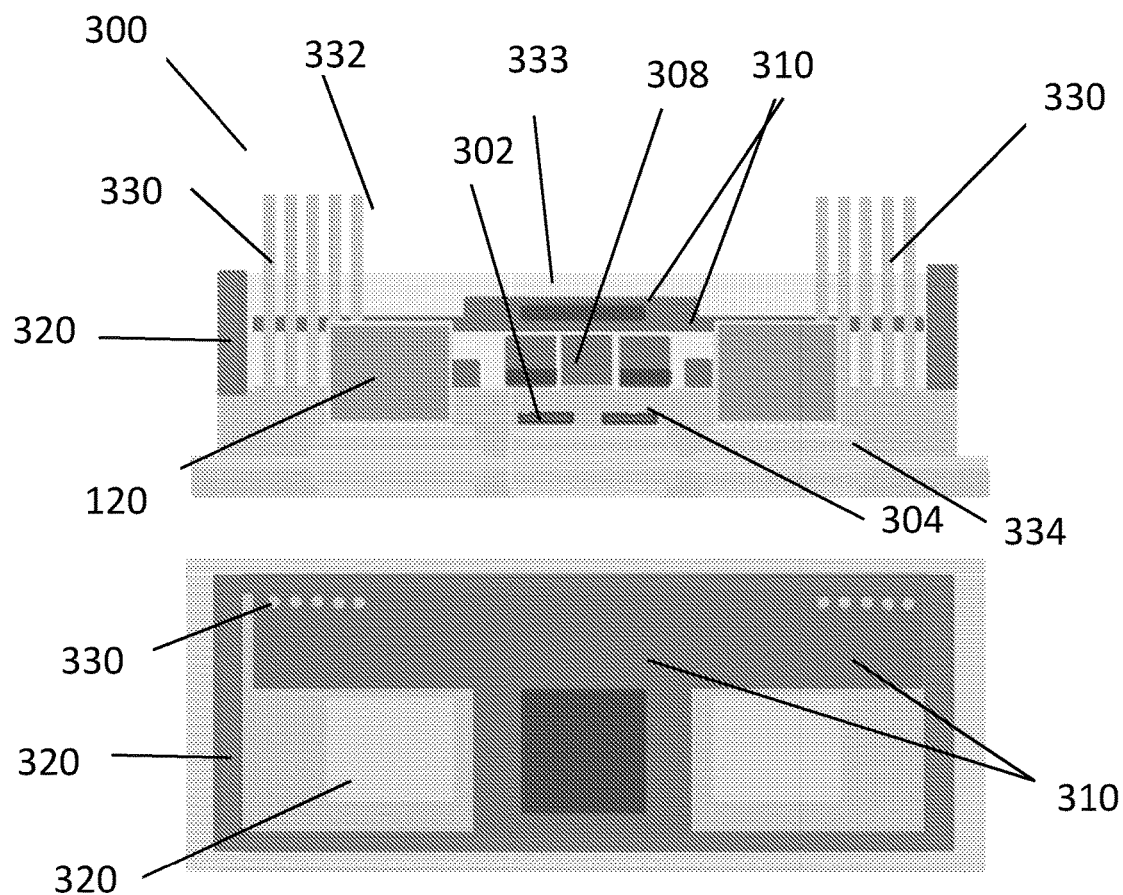
Figure 34G:
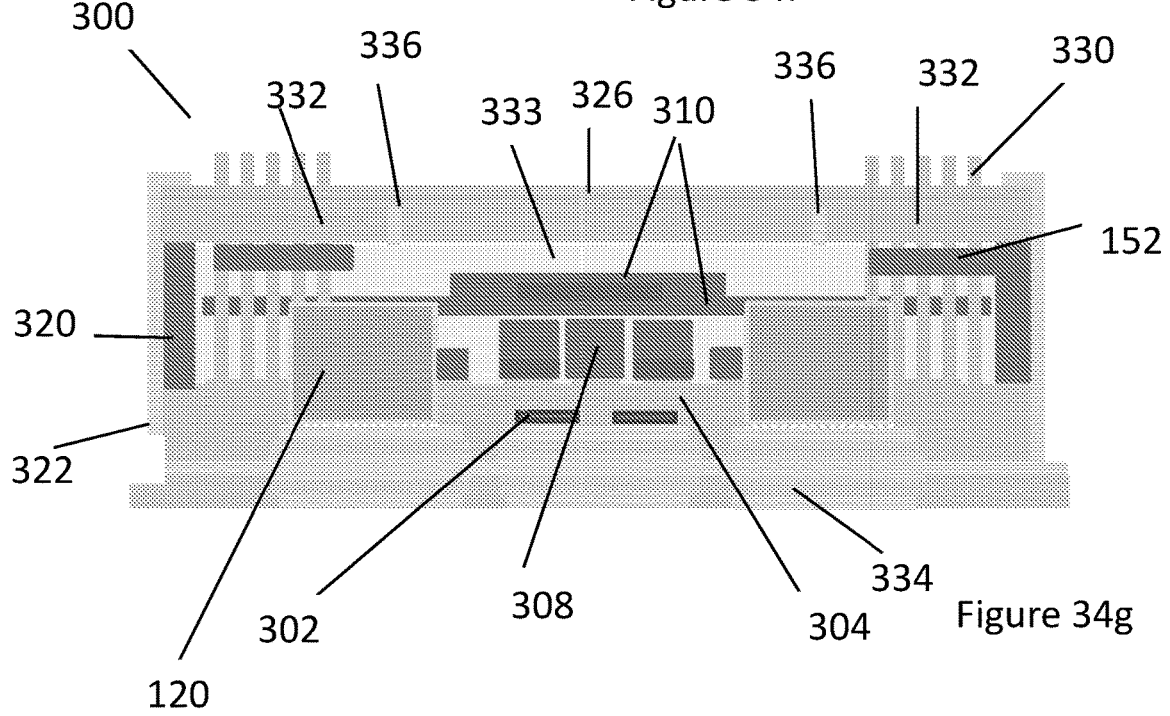
Figure 35:
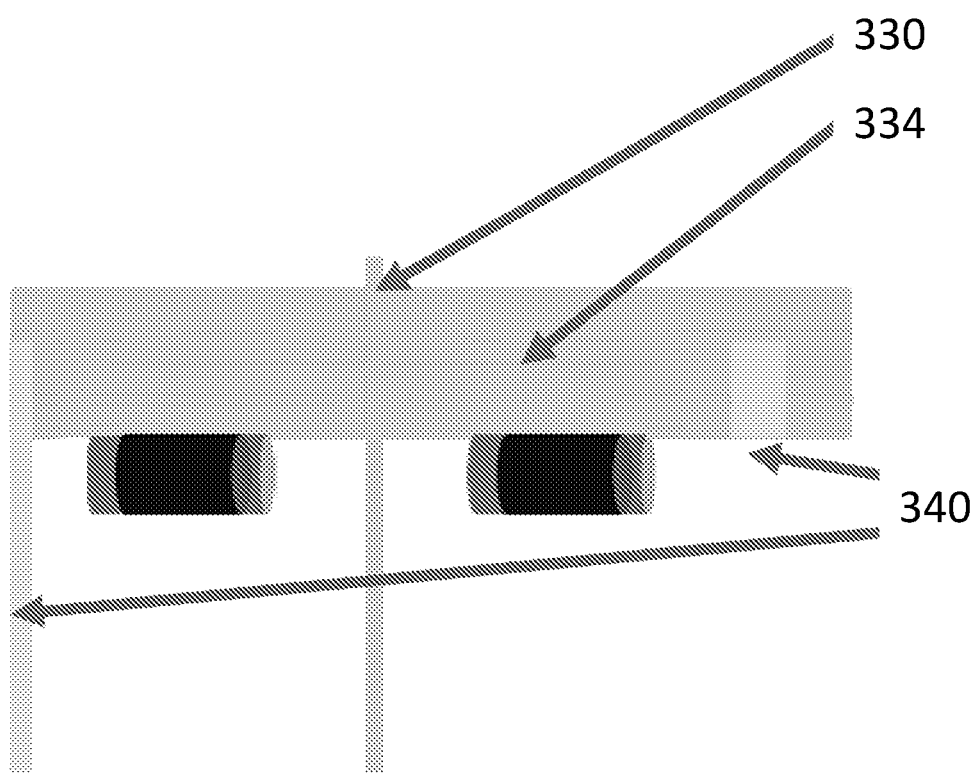

FIG. 32 compares the converter with EMI suppression results with background noise levels FIG. 33 shows a schematic cross-sectional representation of one embodiment of power switches having EM shielding as defined in the present disclosure;

FIGS. 34a to 34g show cross-sectional and top down representations of an alternative embodiment of FIG. 33, as well as detailing steps to generate and construct a power circuit comprising the broadband filter of the previous embodiments;

FIG. 35 shows an exemplary feedthrough labyrinthine path shown in FIG. 34g; and

Figure 36A:
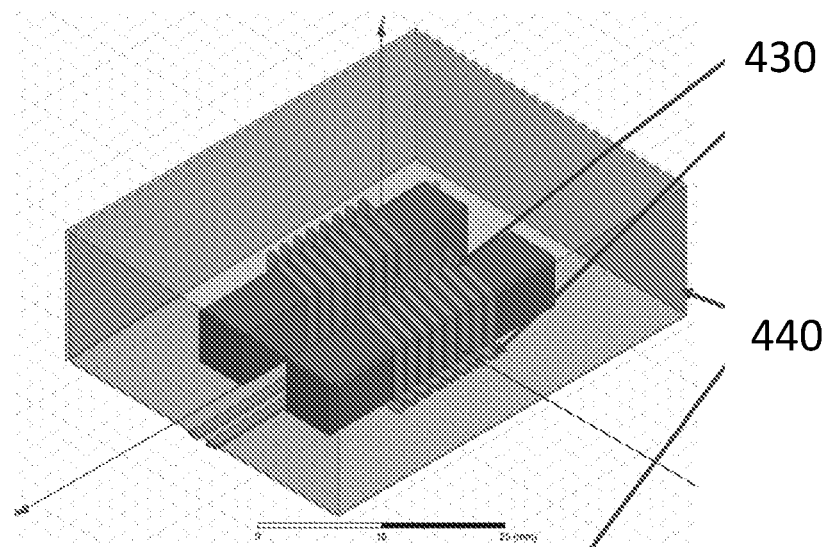
Figure 36B:
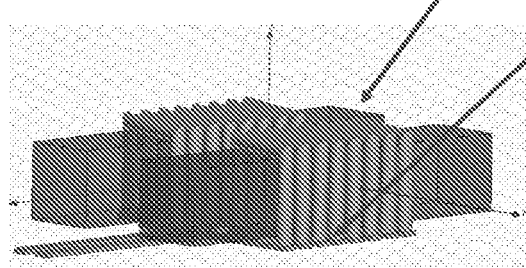

FIG. 36 shows an example of a linked inductor encapsulated according to the present disclosure.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION

Passive filters are widely used to suppress the noise along the propagation path on account of their relatively low cost and high effectiveness. Their general function is to prevent noise current propagation from the source to the load by providing a high attenuation forward path between the source and the load coupled with an effective means to either return unwanted noise to the source or dissipate the associated noise energy in the filter. The detailed design of filters is based on the requirements for attenuation over a specified range of frequencies coupled with requirements for efficiency.

Figure 1:
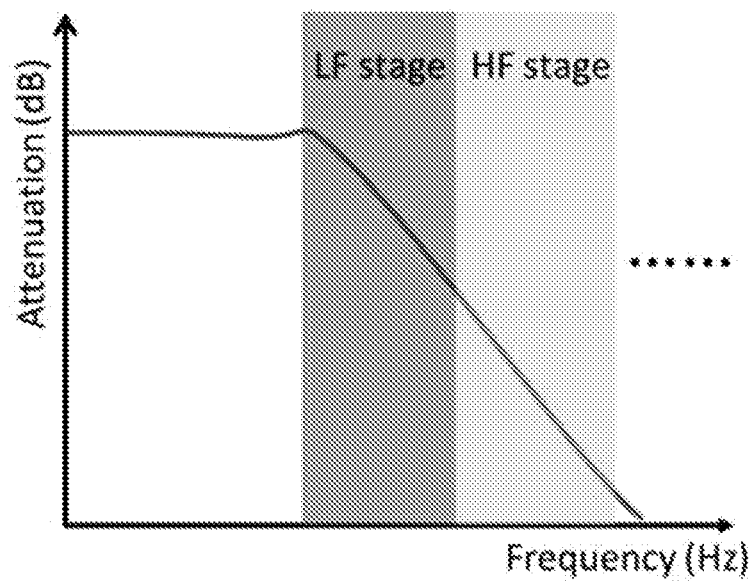

To achieve high noise attenuation and wide stop-band filter characteristics, broadband filters 100 typically consist of a cascaded series of low-pass filters whose configuration and cut-off frequency is chosen to achieve the required level of attenuation over the stop-band. The multiple stop bands from the different filter stages merge into each other to provide continuous noise attenuation from the first cut off frequency, shown in FIG. 1.

High frequency noise generates an extended electromagnetic field along the current path, with electromagnetic (EM) fields propagating outside the conductors, a feature that is enhanced at high frequencies by the skin effect. The changing magnetic and electric fluxes from different conducting paths will interact and can generate unintended (parasitic) coupling over relatively large distances. This can compromise filter performance and cause interference e.g. with sensitive measurement and control circuitry. Thus for high-frequency (HF) noise, it is typical to find a relatively low-impedance, parasitic path coupling the source to the load. Specific mechanisms are needed to block the HF noise and return it to the source. The forward path for EM waves thus needs to be suppressed whilst the reverse (reflected) path needs to have a very low impedance. Conducting screens and shields are often the preferred mechanism for ensuring that there is inherently poor HF coupling between input and output.

Figure 2:
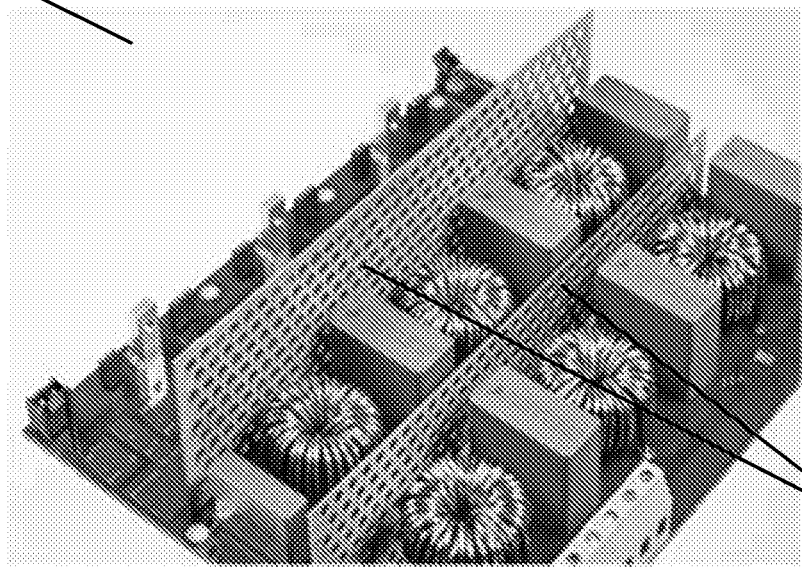
FIG. 2 illustrates known prior art semi-closed shielding.

As a typical solution a broadband filter 10, having partition layers 12 and a conductive mesh or shield layer is inserted between each filter stage to reduce EM field coupling, as shown in FIG. 2. Because the partition layer 12 has a semi-open arrangement rather than being closed like a Faraday cage, parasitics still exist between each filter stage and between source and load. At high frequencies, leaking electric and magnetic fields from the source can easily couple to the load without being properly attenuated.

Figure 3A:
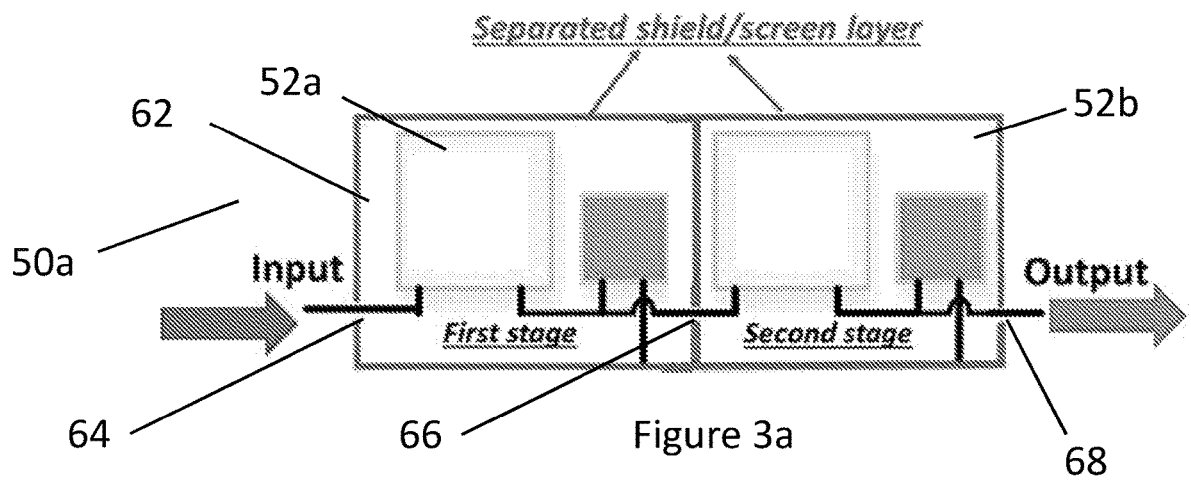
FIGS. 3a and 3b shows a broadband filter according to an embodiment of the present invention.
Figure 3B:
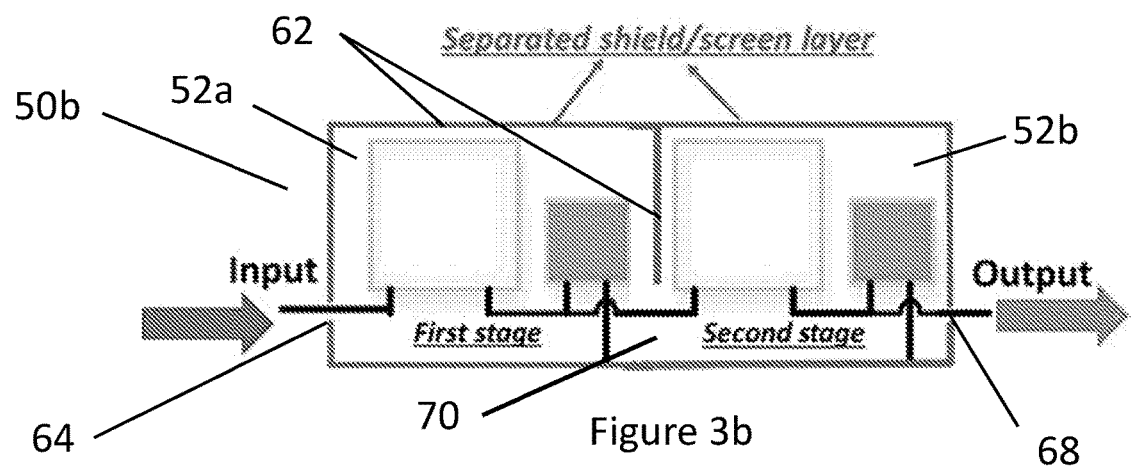

To overcome the limitations of semi-closed shielding 12, separate closed volumes with continuous conducting partitions may be used to shield each stage and return the filtered noise current, as shown in FIGS. 3a and 3b. FIG. 3a shows a filter 50a for use with filter stages 52a, 52b. Each filter stage 52 is encapsulated by a shield layer 62. Feedthroughs 64, 66, 68 allow inputs, connections, and outputs to pass through the shield layer 62. Note that by using the shield layer 62 within each closed volume to return the filter current, HF noise can be more easily confined within each closed volume thereby reducing coupling to subsequent stages and the load. Therefore, noise from the source cannot easily couple to the load because they are separated by a number of closed, separately shielded regions. In addition, any component of noise current that is coupled from one partitioned region into the next will be preferentially returned back to the source rather than propagated to the load. FIG. 3b shows a similar arrangement to FIG. 3a, but with each stage 52a, 52b separated by an opening 70.

Figure 4:
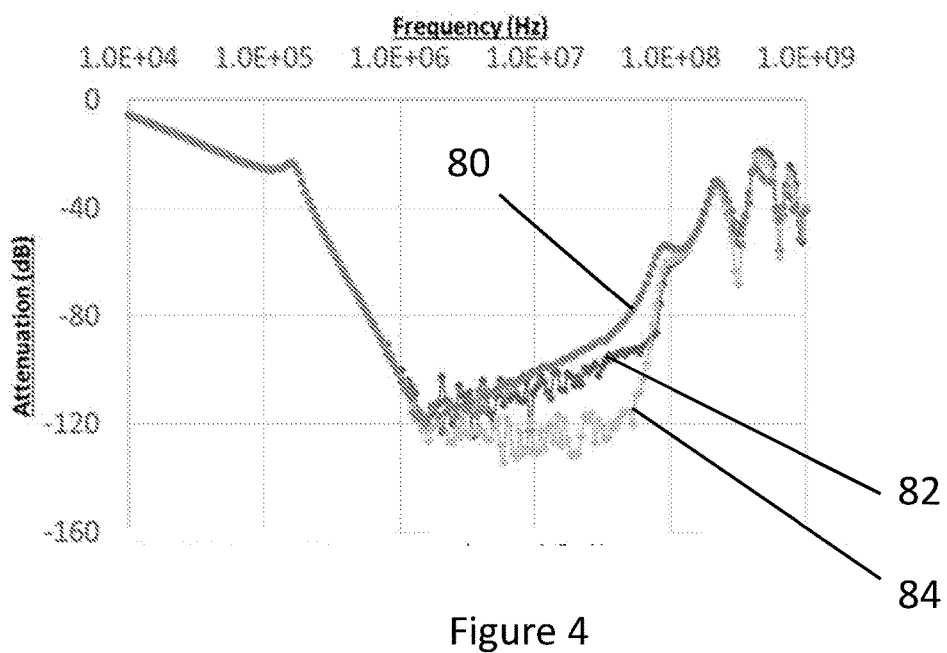
FIG. 4 shows the forward transfer gains of partitioning arrangements including those of FIGS. 3a and 3b.

To illustrate the effects of different partitioning arrangements, s-parameter measurements were made on a 2-stage low pass filter using a Vector Network Analyser (VNA). FIG. 4 compares the forward transfer gains of a non-partitioned arrangement 80, a partially partitioned arrangement 82 (such as shown in FIG. 3b) and a completely closed partitioned arrangement 84 (as shown in FIG. 3a). It is clear that partitioned arrangements 82, 84 can achieve greater noise attenuation, extending the −120 dB noise floor to 70 MHz. Partial partitioning 82 can provide an attenuation of −100 dB at 70 MHz. In the case of using partial partition 82, a significant amount of the HF noise current can still be coupled to load side through the shield layer instead of being shunted back to the noise source. Complete partitioning 84 involves minimising the openings 70 in the individual partitions 62 between the filter sections 52a, 52b. In this case, HF noise is encouraged to flow on the inside of partition layer 66 and be returned to the noise source, instead of flowing to the load side. It should be noted, however, that a simple opening 66 between two partitioned regions is unable to block all EM fields because gaps will inevitably exist between the interconnecting conductor(s) and the partition 62.

Thus, cascaded filter stages, shielding and partitioning strategies can provide very high levels of noise attenuation from 100 kHz to 70 MHz and confine and attenuate both conducted and radiated noise within this frequency range. However, for still higher frequencies, the EM wave length becomes shorter and EM fields can more easily leak from the slots/opening between the filter stages and where external connections are made. This directly impacts the noise attenuation performance of the broad band filter at very high frequencies, typically above 100 MHz.

Application of capacitors provides a very good solution for decoupling EM fields on either side of a shield since their integrated capacitive components provide a low-impedance, reflecting structure. However, state-of-the-art feedthroughs are only available for use at low current (up to tens of Amperes) and with low isolation voltages (up to 100 Volts). They are not suitable for many power electronics where hundreds or thousands amperes flow through filter stages or where voltages may be as high as several kV. Another drawback of state-of-art feedthrough connectors is the relatively small, fixed value of shunt capacitance, which is typically of the order of 1 nF. This feature is restricting where the capacitor is also intended to be applied as part of a filter and whose capacitance thus needs to be selected as part of the filter design. Finally, state-of-art feedthrough capacitors are invariably cylindrical in shape with round conductors. Interfacing such capacitors to the flat rectangular busbar structures, or printed wiring traces found in many power electronic applications, is made difficult and will result in additional series impedance in the interconnections.

As noted above, the effective confinement of HF EM fields requires the filtered noise currents to be returned to the source from each filter stage. To achieve the best HF performance, the impedance of the return path must be minimised and this becomes progressively more important at higher frequencies. It is thus desirable to minimise the length and thus the impedance of all return paths and particularly those associated with the higher frequency components. Filter stages with low cut-off frequency suffer from the effects of large parasitics, which limit the HF performance and thus a high level of HF noise will propagate to the next filter stage. So, if the low frequency cut-off stage is followed by a high frequency cut-off stage the high frequency return currents must flow through the return paths of both stages, yielding a relatively long return path. On the other hand if the high frequency cut-off stage is positioned closest to the source, the high frequency return path will be minimised. The ordering of filter stages relative to the noise source thus becomes important if the highest levels of HF attenuation are to be achieved.

Figure 5A:
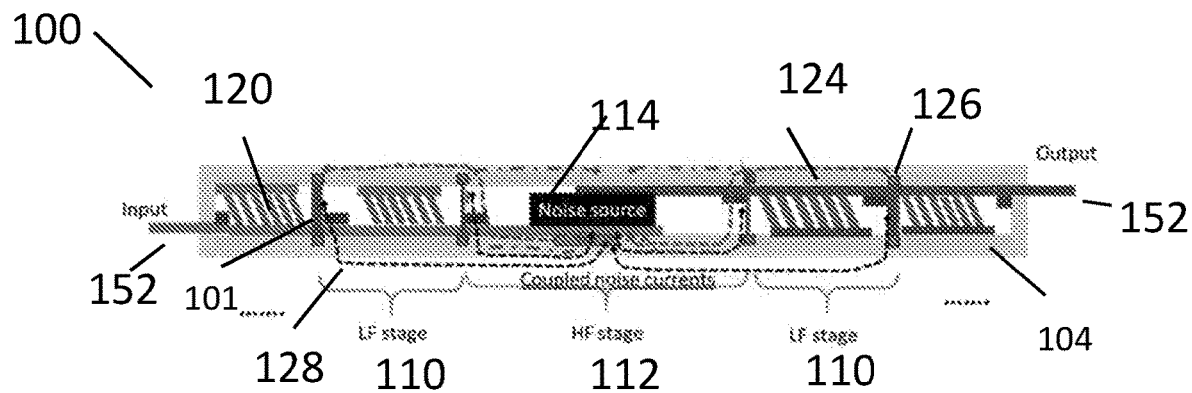
FIGS. 5a-5d show configurations of the broadband filter of FIGS. 3a and 3b.
Figure 5B:
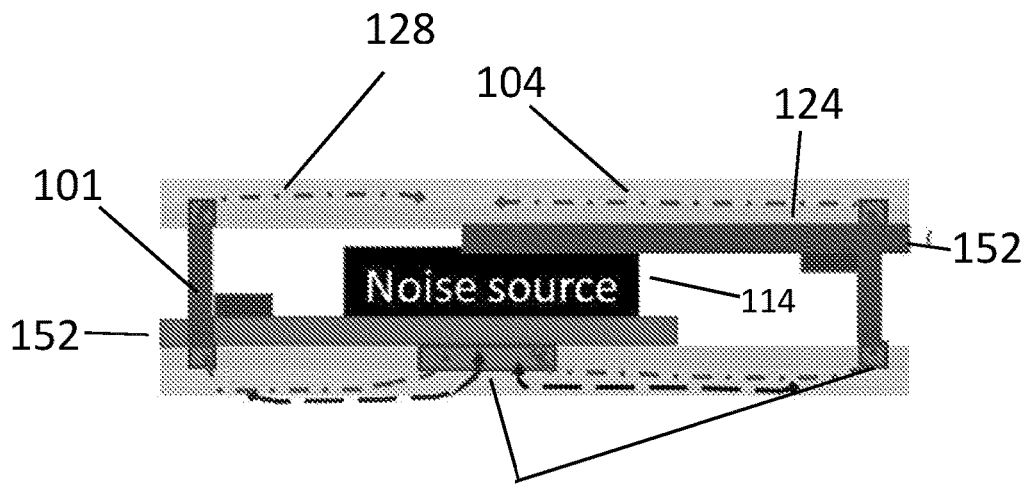
Figure 5C:
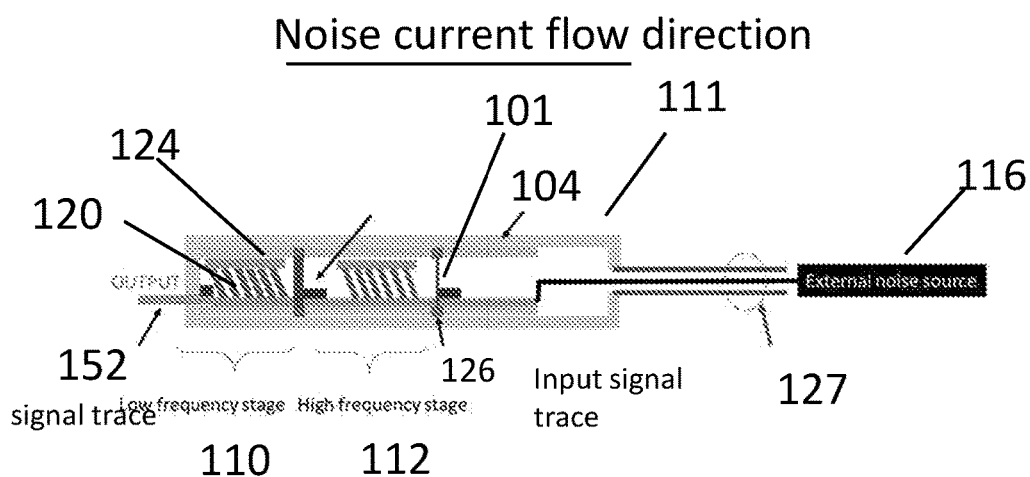

In an embodiment of the present invention, a broadband filter 100 is provided in two distinct configurations: one is for a confined internal noise 114 source where one or more noise sources are contained within the broadband filter arrangement, as shown in FIG. 5a. FIG. 5b shows an expended view of one segment of the broadband filter. The other filter arrangement (FIG. 5c) is for an external noise source 116 where the invention is applied as an in-line filer, as shown in FIG. 5c. In the second case, continuity of the shield layer 104 around the noise source 114 and between the external source 116 and filter, for example by use of a coaxial connection 127, is needed to prevent high frequency EM coupling between the external noise source 116 and the load. The main function of these two configurations remains same, which is confining and attenuating noise.

Figure 5D:
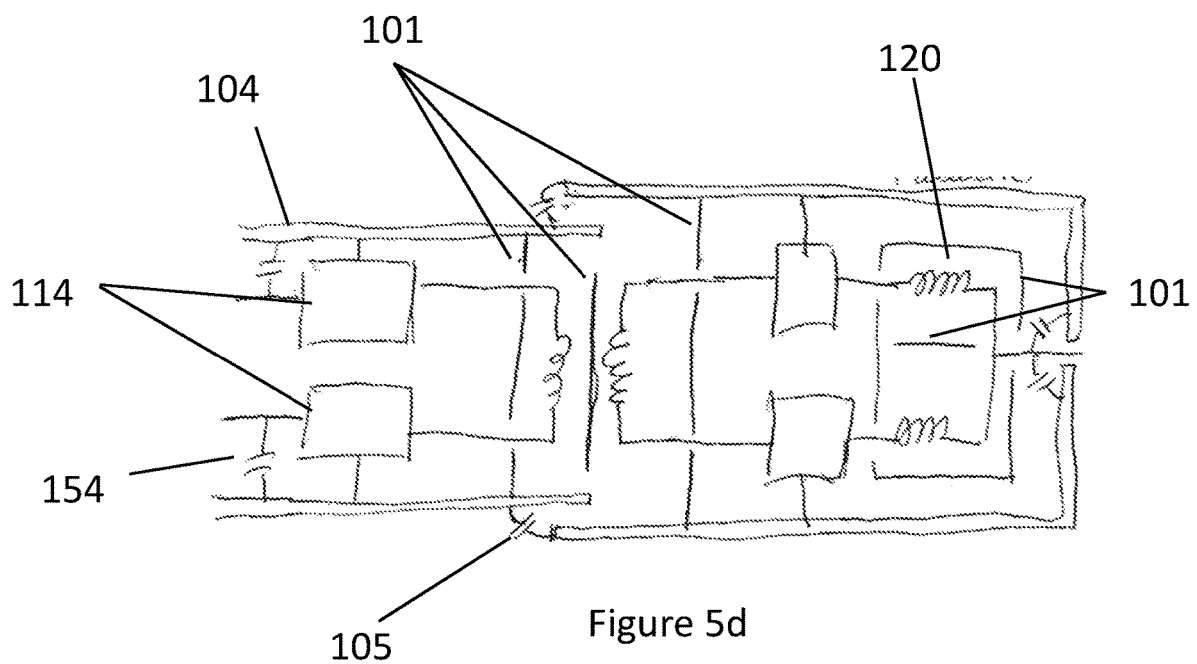

The broadband filter has one or more external conductive shield layers 104, which are extended to include the internal noise source(s) 114, partition layers 101, integrated inductors 120 and capacitors 154. The shields 104 may be continuous or may contain apertures, for example to allow external connections to be made. The shield layers 104 can be made to any shape/size adapted to various cases and applications. One or more isolating layers 124 such as ceramic layer or FR4 layer may be inserted between the shield layer 104 and any circuit traces to provide electrical isolation from the shields 104. The shields 104 may be electrically isolated from one another but electrically connected to different parts of the filter as shown in FIG. 5d. The shields 104 are arranged so as to minimise the gaps and provide electromagnetic coupling between the shields 104 so that they provide substantively continuous electromagnetic confinement for a selected range of frequencies of electromagnetic interference. Electromagnetic coupling can be effected by overlapping or interleaving the shields 104 and/or by the addition of capacitors. Such a configuration would be typical where galvanic isolation of the power or signal path is required.

Shield layers 104 have two functions, namely confinement of magnetic and electric flux. As a magnetic field confinement, the thickness of conductive layer must be several times the skin depth of the lowest noise frequency to ensure sufficient attenuation of induced eddy currents. For instance, for shielding magnetic noise of 100 MHz with Copper, a layer of thickness at least 26 microns is required. As a noise current return path, the shield layer is electrically connected to the associated noise source(s).

The shield may or may not be connected to "ground" or to some other reference potential. Each partition 101 is electrically connected to a shield layer 104. The arrows 128 in FIGS. 5a and 5b show an example of how electromagnetically coupled field is returned through shield layer 104 using vias (126) which penetrate the insulating layers 124 to connect the partitions 101 and shield 104. The arrows indicate possible return paths for electrically and magnetically coupled noise. The shield 104 and partition 101 may also be connected using metal pillars or by directly joining the partition 101 to the shield 104 by soldering or a similar joining process.

To effectively attenuate RF noise and magnetic coupled noise, the thickness of the partition must be several times of skin depth of the lowest frequency that must be blocked by this partition. As seen from FIGS. 5a and 5c, two-stage filters can accommodate partitions 101 of varying thickness. The partition 101 at HF stage may be tens of microns thick, which is enough to attenuate very high frequency noise and provide a return path back to the noise source. The partition 101 at the second stage is typically thicker than that in the first stage with hundreds of microns thickness to attenuate lower frequency of RF noise. The thickness of successive partitions 101 is gradually increased to effectively attenuate noise from high frequency/RF range to low frequency range. The thickness of the external conducive shield layer 104 is mm thickness to provide an effective EM shield at the lowest stop-band frequencies. Since the noise frequency of noise current from outer stage is much lower than the inner stage, a thin partition conductive layer 101 between the two could provide low impedance for frequencies below the inner stage cut-off frequency and let low frequency noise EM field easily pass through (diffusion through partition). In the case of thick partition layer 101 at the 1st stage, noise below the inner stage cut-off frequency will encounter a high impedance in the forward path since it must diffuse through the partition 101. Use of thick partitions 101 throughout will absorb lower frequency noise in the forward path but this could generate excess losses in the partitions 101. Thus each filter stage is designed to remove noise only over a band of frequencies where the combination of filter components (L, C) 120, 154 and partition 101 can provide an effective and efficient mechanism for attenuation.

Magnetic components such as inductors and transformers can be realised by off-the-shelf conventional wound components, with or without a magnetic core, or may be integrated as part of the circuit traces. In this latter case the winding turns may be formed on the surface of insulating substrates, embedded within the substrate for example using vias (126) or be formed between multiple substrates using conducting bumps, pillars or similar structures.

For HF noise filtering, an air-cored configuration 131 is often preferred to avoid hysteresis losses and eddy current core losses at HF, as shown in FIG. 6. Here the shield and partition layers may act as a "wave guide" structure to contain all HF magnetic field inside or around the magnetic components. On the other hand, for LF noise filtering, a configuration with a magnetic core 136 is often preferred to increase magnetic flux density and inductance.

Figure 6A:
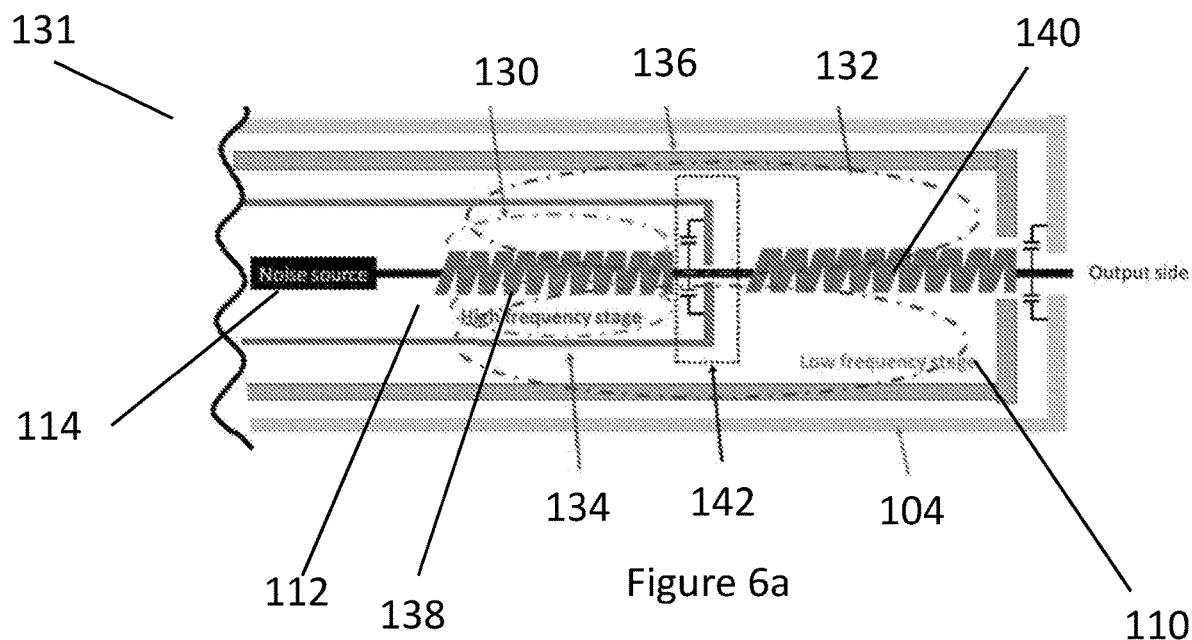
FIG. 6a-6b shows one possible configuration for HF noise filtering used in the broadband filters of FIGS. 5a-5c.

In FIG. 6a the HF stage 112 is contained within the flux path of the LF stage 110. The two stages are connected via a feedthrough connector 142. Frequency-selective coupling of inductors 120 in adjacent filter stages may be facilitated by choosing an appropriate partition thickness and geometry. The high-frequency components 130 of magnetic flux are reflected by the partition 134 and return to the high frequency stage inductor 138. The lower frequency components 132 can penetrate the partition 134 and couple with the low frequency stage inductor 140. A low-frequency flux return path that lies outside the high-frequency stage partition 134 can make this coupling more effective, for example by using an appropriate magnetic material 136. In this way all of the turns of both inductors are linked by the low-frequency flux 132, permitting more effective use of the combined inductor windings. Note that with this arrangement careful design is required to achieve a suitable compromise between high-frequency and low-frequency performance.

Figure 6B:
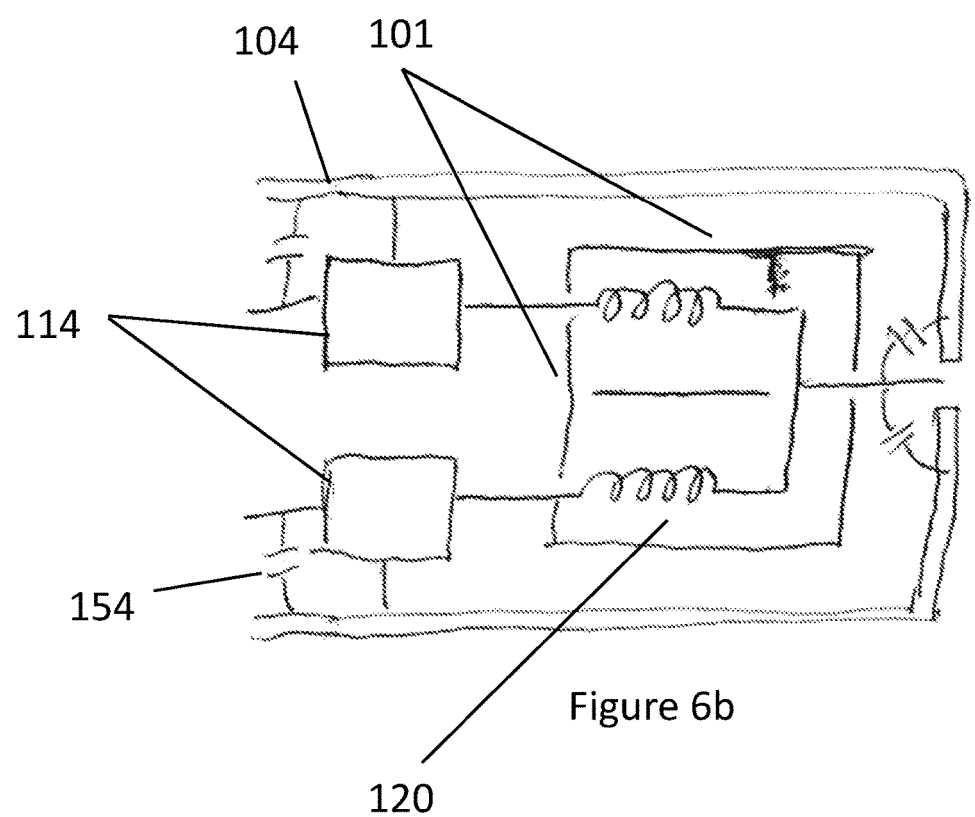

In FIG. 6b, two noise sources 114 are coupled using an air cored pair of coupled inductors 154. Here a combination of a high-frequency blocking partitions 101 is used to confine the magnetic flux produced by the inductor 154 and control the degree of coupling. Lower frequency flux frequencies are confined by the low-frequency shield 104.

Figure 7:
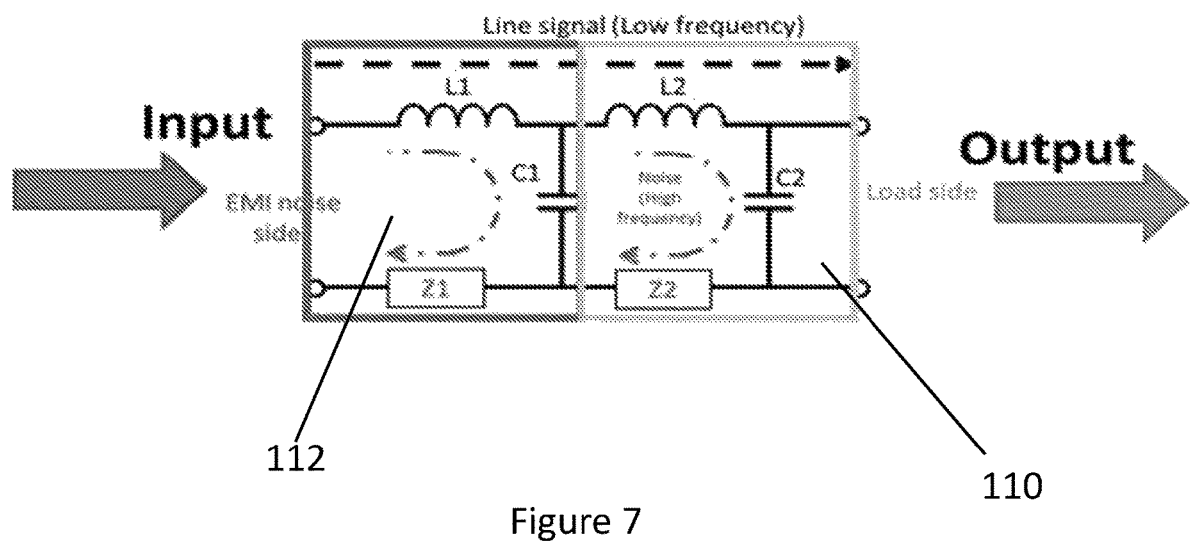
FIG. 7 shows how filter stages act relative to input and output signals.
Figure 8:
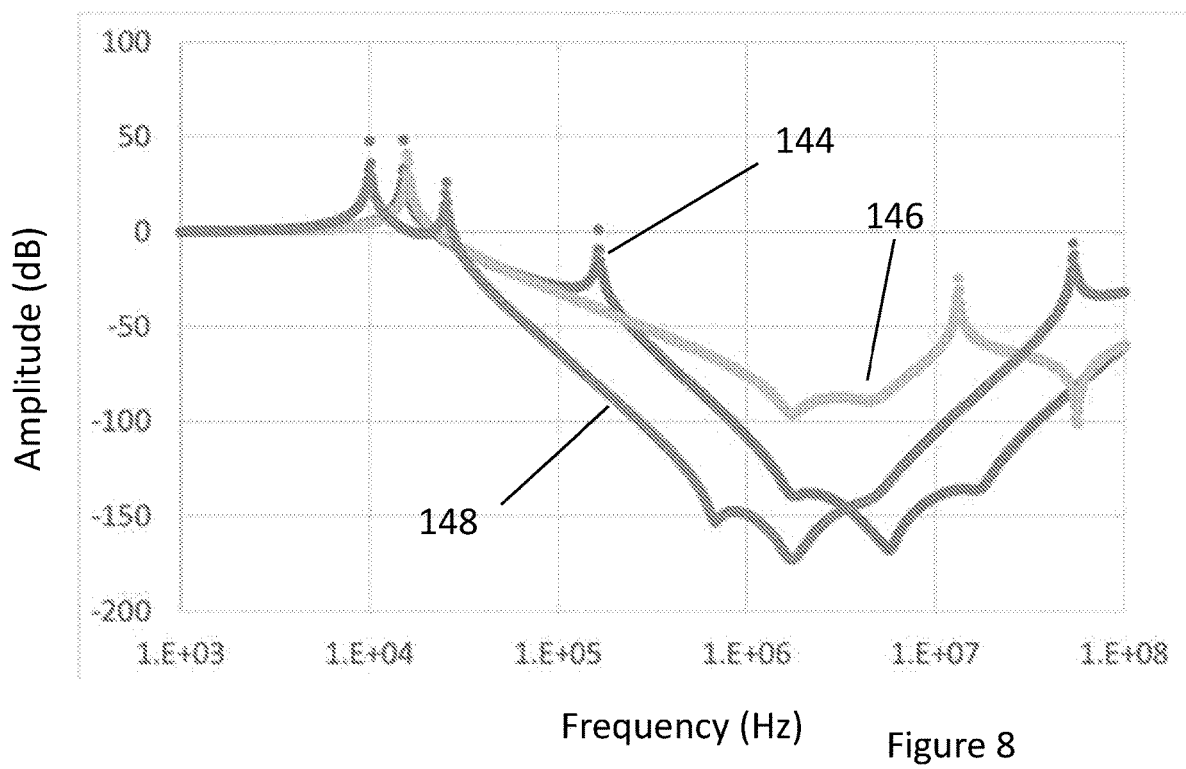
FIG. 8 shows the impact of changing the cut-off (resonant) frequency of the high frequency stage relative to the anti-resonant frequency of the low frequency stage in a 2-stage low-pass filter.

In order to achieve the highest noise attenuation level through cascaded filter stages, it is desirable: 1) to place the highest frequency stage 112 closest to the source 114, with progressively lower cut-off frequencies in subsequent stages, as illustrated in FIG. 7; and 2), to align the anti-resonant frequency of LF stage with the cut-off frequency of HF stage. In each filter stage, noise attenuation is degraded after the anti-resonant frequency due to parasitic elements (ESL, EPC). The next highest cut-off filter stage (higher frequency stage) needs to take over the attenuating role from the previous stage (lower frequency stage) to achieve the fastest roll-off rate and to yield an extended stop-band. FIG. 8 illustrates the impact of changing the cut-off (resonant) frequency of the high frequency stage relative to the anti-resonant frequency of the low frequency stage in a 2-stage low-pass filter. Line 144 shows a case where the anti-resonant frequency of the LF stage is substantially aligned with the resonant frequency of the HF stage. If the anti-resonant point of the LF filter stage is well below the cut-off point of the HF stage, the overall noise attenuation would get worse right after the first anti-resonant point (line 146). Conversely, if the HF cut-off is well below the LF anti-resonant frequency and very close to LF cut-off (line 148), it could cause the faster and steep roll-off frequency response after HF cut-off, however, the high values of L and C needed to realise the HF stage result in high ESL and EPC, and HF noise attenuation becomes worse.

Figure 9:
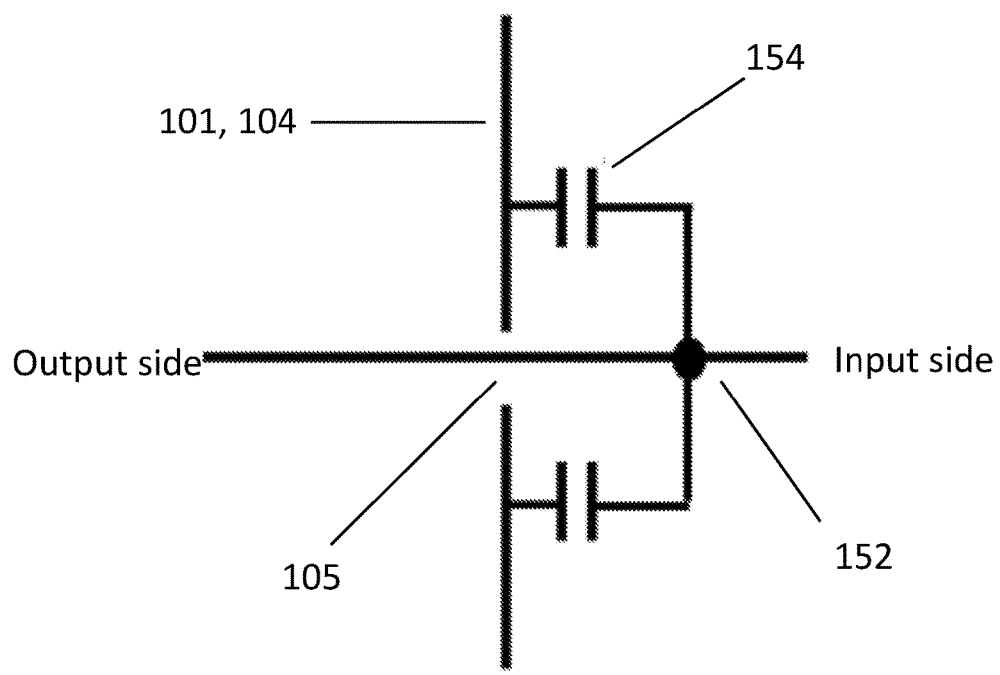
FIG. 9 shows the effect of apertures in the partitions.

Even with careful arrangement of filter stages, shields 104 and partitions 101 there are unavoidable apertures 105 in the partitions 101 and shields 104 where the connections are made. RF electromagnetic noise/fields can "leak" through the slots and make the partitioning 101 and shielding 104 structure less effective. The solution adopted is to cover the apertures 105 between the signal conductors and partitions/shields 101, 104 using capacitors 154, whose layout around the aperture 105 and internal structure is chosen to provide a low impedance, high-frequency EM path from signal conductor to partition/shield 101, 104, shown in FIG. 9. The effect is two-fold. Firstly, the capacitors 154 form part of the filter stage capacitance, bypassing high frequency currents from the signal conductor 152 to the partition/screen 101, 104 (other capacitors may be added remote from the aperture to achieve specific values of capacitance and the correct filtering function in combination with the filter stage inductance). Secondly, the construction of typical capacitors includes multiple layers of metal in the capacitor structure together with metal end-caps, which act to reflect and absorb incident electromagnetic fields. RF noise is thus reflected back into the filter stage rather than being allowed to propagate. With the combination of partition/shield layer 101, 104 and integrated capacitor 154, all radiated noise and high frequency noise can be blocked and confined, only letting low frequency noise and the intended signals pass though. The choice of capacitor type, capacitance, number and their physical layout together with the thickness of the partition/shield 101, 104 and filter inductance will determine the effective low-frequency cut-off. Note that this arrangement differs from that of a conventional coaxial feedthrough capacitor in that: 1) it is integrated with the partition/shield 101, 104 and filter inductor 120 to provide a specific filtering function rather than simply being a physically separate high-frequency bypass; 2) it can be designed to accommodate arbitrary signal conductor geometries, for example flat bus-bars or circuit traces, rather than being limited to round wires.

Figure 10A:
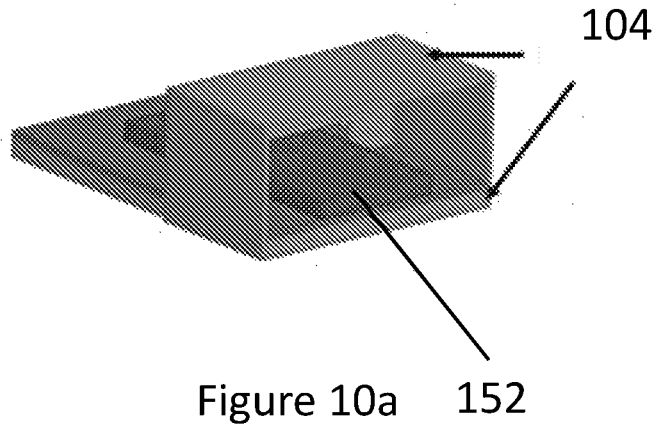
FIGS. 10a-10c shows show a typical configuration where a power trace passes through a shield or partition layer.
Figure 10B:
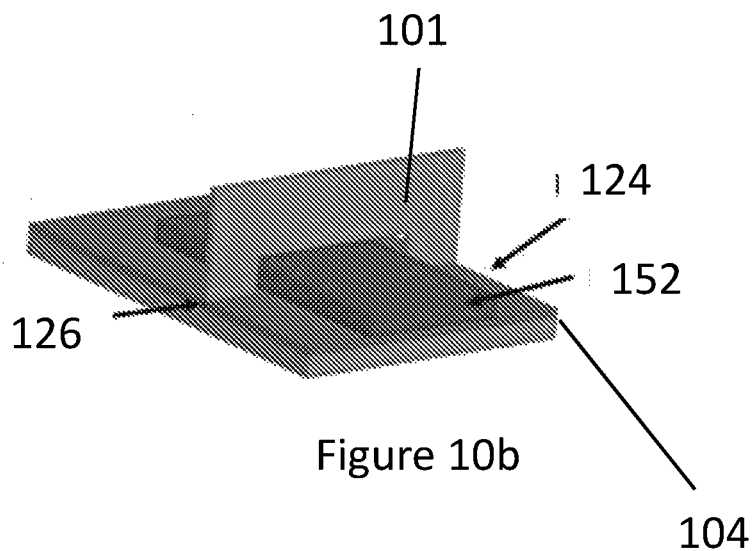
Figure 10C:
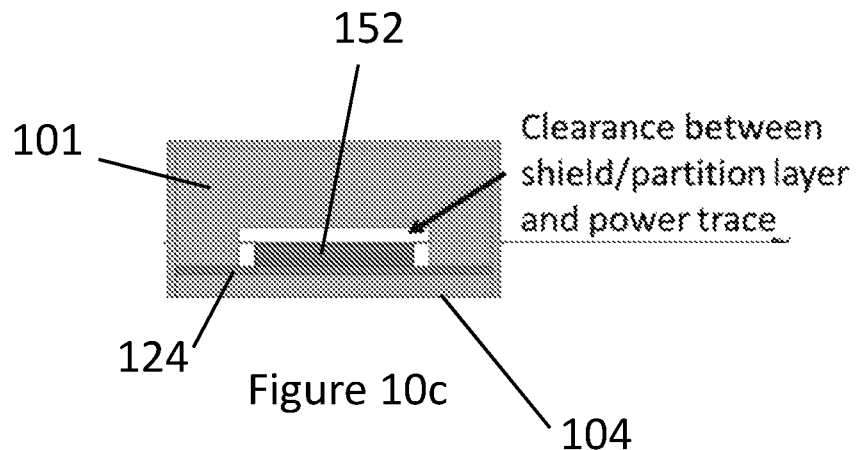

FIGS. 10a and 10b show a typical configuration where a power trace 152 passes through a shield 104 or partition layer 101. FIG. 10c shows a side view of the interface of power race with shield/partition layers 104, 101. As discussed above, the gaps 105 around the power trace 152 offer a route for EM fields to leak across the shield/partition 104, 101. The width of the gaps 105 or slots is the key factor determining the degree of electromagnetic field leakage. Based on slot antenna theory, we can determine the shielding effectiveness of a single aperture. Because a slot antenna is a most effective radiator when its maximum linear dimension is equal to ½ wavelength, we can define the shielding for this dimension to be 0 dB. As the aperture becomes shorter, the radiation efficiency will decrease at a rate of 20 dB per decade, hence the shielding effectiveness will increase at the same rate. Therefore, for an aperture with a maximum linear dimension equal to or less than ½ wavelength, the shielding effectiveness in dB is equal to $$S = 20\log\left(\frac{\lambda}{2l}\right)$$

where $\lambda$ is the wavelength and/is the maximum linear dimension of the aperture. Table 1 shows the maximum slot sizes for an aperture 105 for 20 dB shielding of radiation of different frequencies.

TABLE 1

Maximum gap or slot length versus frequency for 20 dB shielding

| Frequency (MHz) | Max. Slot (mm) |
|---|---|
| 30 | 457 |
| 100 | 152 |
| 300 | 51 |
| 500 | 30 |
| 1000 | 15 |

To mitigate the HF EM field leakage, apertures 105 in shields 104 and partitions 101 may be surrounded by capacitive components connected between the power trace 152 and the shield/partition layers 104, 101. They provide an EM field reflecting capability and in addition bypass lower frequency current components to the shield 104 so they can be returned to the source. A minimum clearance between shield/partition 101, 104 layers and the power traces 152 must be kept to avoid insulation breakdown and partial discharge (PD). This is particularly important where the voltage potential of shield 104 and power trace 152 differ by hundreds (or even thousands) of volts, for example in power electronic filtering applications. On the other hand, unnecessary clearance could leak RF and HF noise from partition layer 101 and compromise shielding effectiveness.

Shown in FIGS. 11a-f, one or multiple reflecting capacitors 154 are integrated onto a power trace 152. One side of capacitor 154 is connected onto the power trace 152 and the other side of it is connected to inside of the shield 104 layer or partition 101, and the shield layer 104 is connected to the shield layer 104 on the other side of substrate through via(s) (126), and electrically isolated from the power trace 152. A disadvantage of the arrangement shown in FIG. 11a-b is the presence of a very long slot between power trace 152 and shield 104 which will encourage EM field leakage at HF. An alternative solution, using two or more capacitors 154 that are integrated onto the power trace 152, is shown in FIGS. 11c-d and 11e-f. Here the smaller slots (156) allow for higher levels of HF attenuation. The number and size of the capacitors 154 may by varied in order to fit onto the power trace 152. Using this principle, gaps on the top and at the sides of power trace 152 can be filled by capacitors 154. However, as shown in FIG. 12, some EM field can still propagate through the insulating layer 124 between the power trace 152 and the bottom shield layer 101 as there are no reflecting capacitor(s) 154 on the back side of power trace 152. It should also be noted that leakage can occur through the small gaps that exist between and around the capacitors 154, for example through the insulating layer 124 between the capacitor 154 and the power trace 152.

At LF (below ~10 MHz), the gaps between shield layer 104 and power trace 152 might not cause not much difference on EM field confinement, since in this frequency range the capacitors 154 can still act as an effective shunt path to return noise current through the shield 104 and partition layers 101. However, these configurations have much less capability to effectively block HF (>10 MHz) EM fields.

To provide an effective reflecting and blocking structure, thin capacitor(s) 154 may be embedded into the insulation layer 124 to form a layout where power trace 152 is surrounded by capacitors 154 on all sides. However, in typical busbar/PCB implementations, the insulation layer 124 is not thick enough to embed a typical multi-layer ceramic capacitor 154, so modifications to the power trace 152 and/or insulating layer 124 are needed.

Figure 13A:
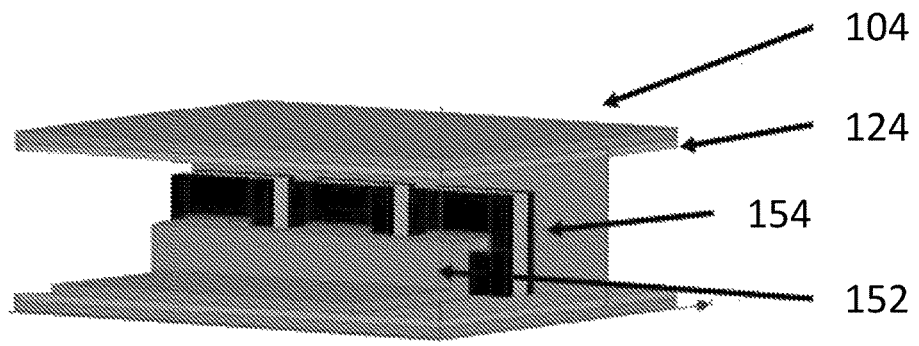
FIGS. 13a and 13b show an alternative embodiment of the power bus and capacitor arrangement.
Figure 13B:
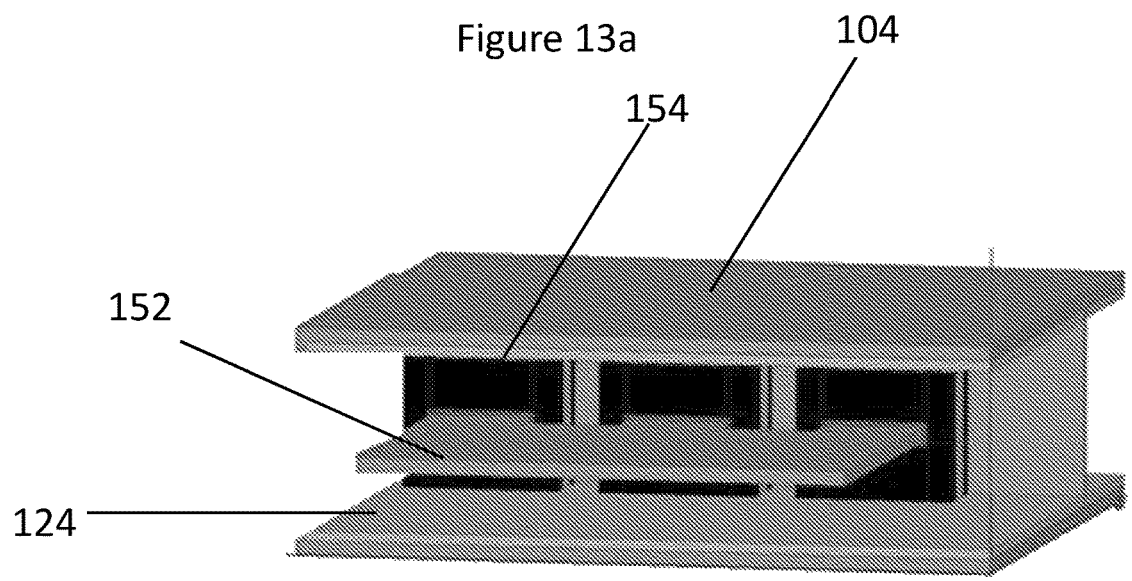
Figures 14A, 14B, 14C:
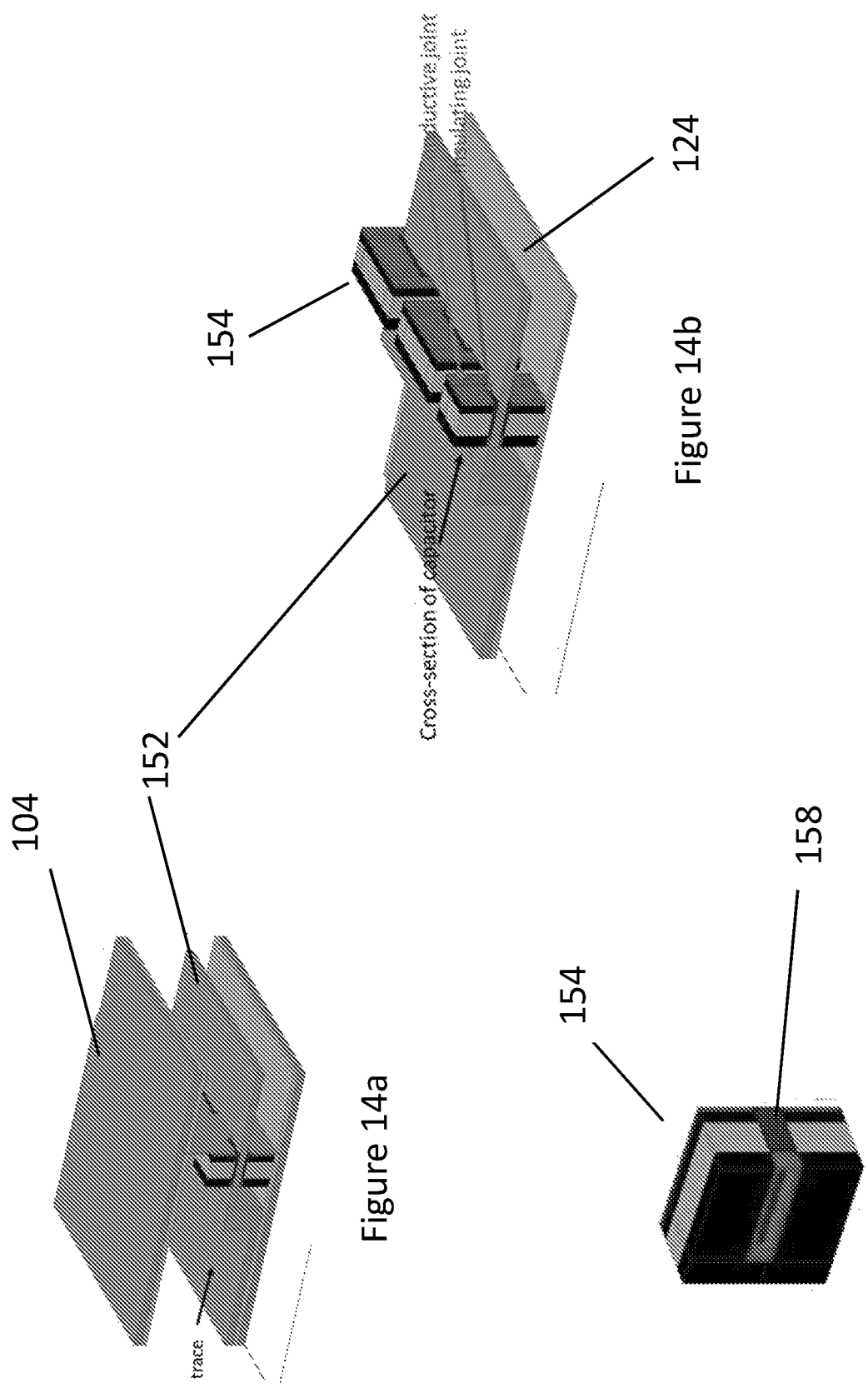
FIGS. 14a-14c show a typical configuration where a power trace passes through a shield or partition layer.

FIGS. 13a and 13b shows an alternative solution in which a lifted power trace/power bus 152 is surrounded by integrated capacitors 154 emulating the desired coaxial structure. In this case, there is no small gap through which RF or HF EM waves could leak and propagate outside. All EM waves are blocked and reflected by capacitors 154 and EM fields inside and outside of each partition are completely decoupled. Further details regarding the feed through arrangement and cross-sections are shown in FIG. 14a-14b. FIG. 14c shows a diagram with integrated capacitors 154 having a coaxial structure. Here, every power trace 152 is surrounded by 4 capacitors 154 on the top, bottom, left and right side. The left side of capacitor 154 is connected onto the horizontal power trace and the right side of the capacitor is connected onto the vertical, inner side of partition layer 101. Electrical isolation 158 indicated in FIG. 14c is inserted between each capacitor 154 and power trace 152 and the partition layer 101 is electrically connected to both top and bottom shield layer 104. The insulated slots/openings (156) provided for the power traces 152 in the partition layer(s) 101 should be kept as small as possible to minimise EM field leakage.

Figure 15B:
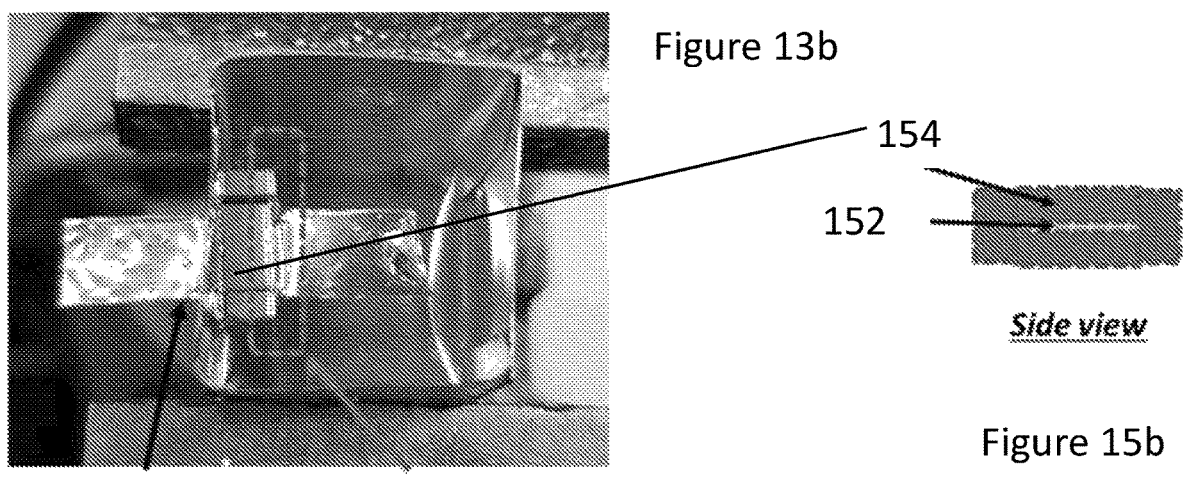
FIGS. 15a and 15b show a practical arrangement of shield layer with feed through capacitors.
Figure 15A:
Figure 16:
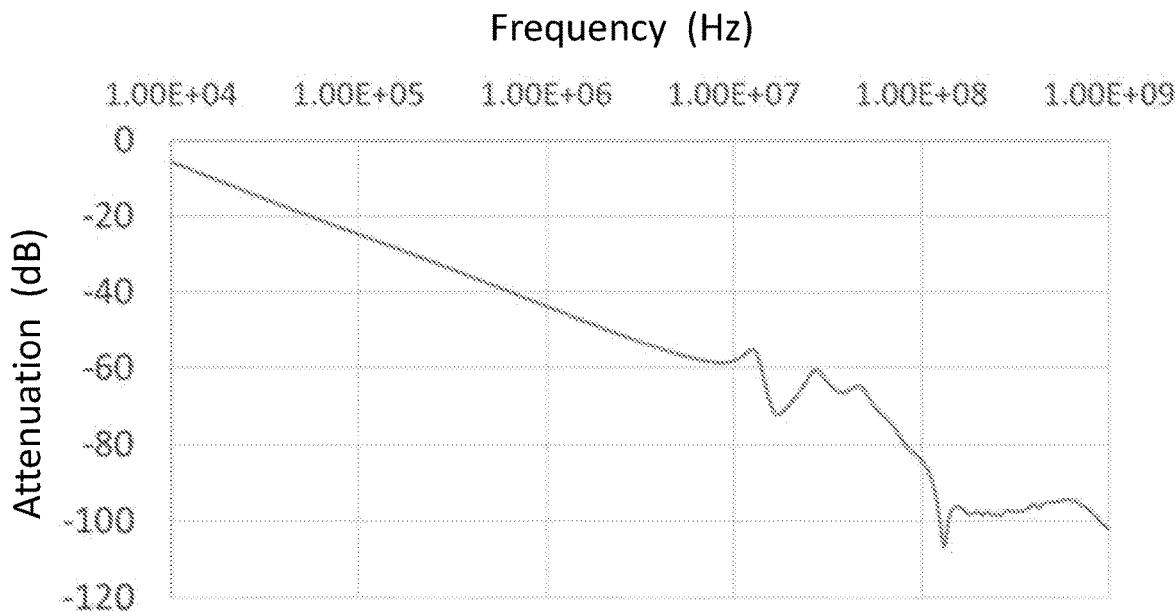
FIG. 16 shows the attenuation from the arrangement of FIGS. 15a and 15b.

For high current connections, it is preferable to divide one broad trace 152 into several parallel small traces with integrated capacitors 154 positioned around each of these small traces. This reduces the size of the individual apertures improving the shielding effectiveness at high frequencies. FIGS. 15a and 15b show a practical arrangement of a combination of shield layer 101, 104 and feed through capacitors 154. A rectangular bus bar 152 is surrounded by 4 chip capacitors 154, one side of capacitors 154 is soldered onto the bus bar 152 whilst the other side of the capacitors 154 is soldered to the inside of the shield 101, 104. In this experiment setup, kapton tape is used to realise electrical isolation between capacitors 154 and the bus bar 152. Measurements of forward transfer gain were made using a VNA with a 50 ohm source impedance. The results shown in FIG. 16 indicate that the configuration of combination of integrated capacitors and shield layer acts as a low pass filter. At frequencies below ~10 MHz the response follows that of a classic single-pole low-pass filter with a cut-off rate of —20 dB/decade. Above 10 MHz frequency range, the shield 101, 104 and integrated capacitor 154 can effectively reflect and contain both conducted and radiate EM noise, electromagnetically decoupling the noise source from the load. An attenuation level of over 100 dB is maintained from 100 MHz till 1GHz.

Figure 17:
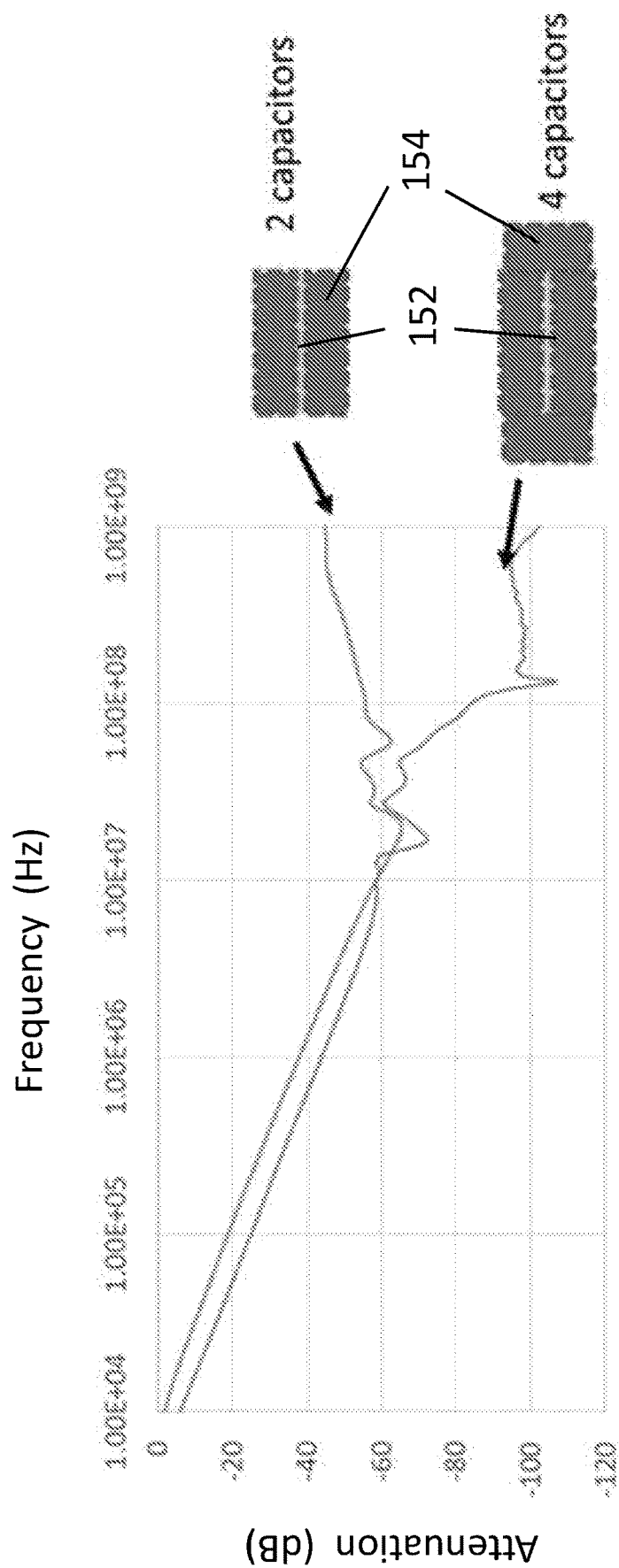
FIG. 17 shows the attenuation from alternative capacitive arrangements.

Note that in the arrangement shown in FIGS. 15a and 15b the aim is to completely surround the bus-bar 152 with capacitors 154. However, small gaps will inevitably be present between each capacitor 154 and these can provide a path for electromagnetic leakage through the bus-bar slot insulation. This effect will become much more noticeable if the feedthrough arrangements does not encircle the bus-bar 152, for example using a capacitor on just one or two faces of the bus-bar. One such realization of a feed through structure is shown in FIG. 17, where only two capacitors 154 are integrated on the top and bottom of the bus bar 152, whilst the left and right side is left open. Due to the connection of capacitors 154, only the top and bottom of bus-bar are electrically connected to shield/capacitor whilst the sides of bus bar are left open, allowing EM field leakage through the sides of the slot insulating layer. The impact of this arrangement is indicated in the measurement comparison shown in FIG. 17. From 10 kHz to 10 MHz, there is only a small difference in noise attenuation indicating that EM leakage through the sides of the slot has relatively little impact. However, above 10MHz, the sample with only two capacitors 154 shows an inferior noise attenuation characteristic, resulting in more than 40 dB difference above 100 MHz. In conclusion, we can see that an incomplete feedthrough structure cannot completely prevent high frequency EM leakage and thus a feed-through solution in which the blocking capacitors completely surround the bus-bar 152 is preferred.

Figure 18:
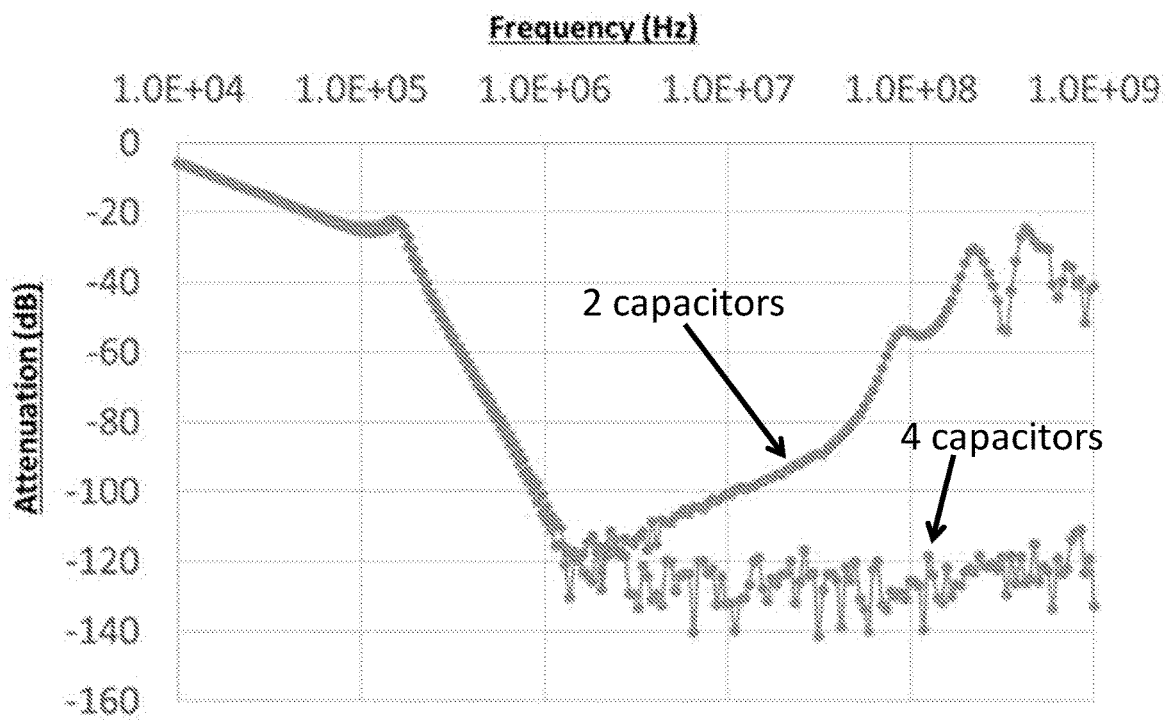
FIG. 18 shows the overall performance of the proposed broadband filter.

Combined with previous techniques such as multi filter stages, shielding, partition, the overall performance of the proposed broadband filter is shown in FIG. 18. The attenuation characteristic initially displays a −40 dB/decade slope above the low-frequency stage cut-off frequency which increases to −80 dB/decade above the high-frequency stage cut-off frequency. With partitions and reflecting structures, the response falls below the noise floor (~−120dB) and remains at this level to beyond 1 GHz. This result clearly demonstrates that the feedthrough/EM field blocking structure successfully confines EM noise inside the shield. By way of contrast, the response of a more conventional arrangement, without inter-stage partitions and reflecting structure shows significant deterioration in attenuation above 1 MHz.

Figure 19A:
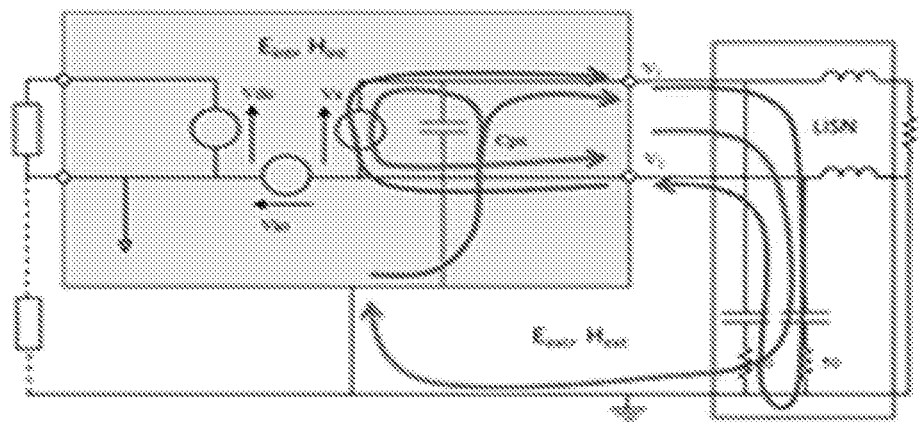
FIGS. 19a-19c show the effect of adding filter stages and shields to reflect and suppress EM noise.
Figure 19B:
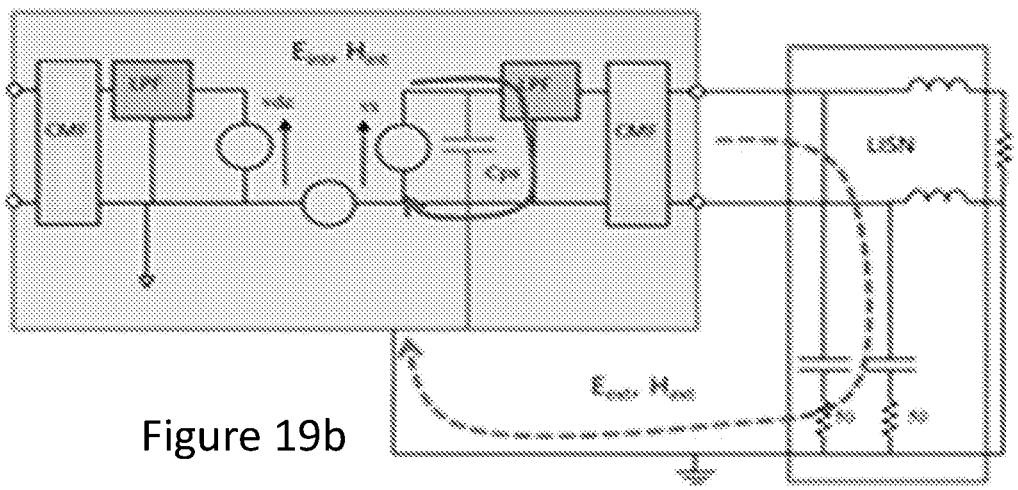

An important application of this type of broadband filter is the confinement of electromagnetic interference generated by switched-mode power converters, for example dc-dc converters or inverters. Electromagnetic interference arises from the rapid voltage and current transitions occurring during operation of the switching cell within power converter. A simplified model of the sources of EMI, the propagation path and a typical measurement arrangement for conducted EMI is showed in FIG. 19a. Suppression of EMI is typically achieved by a combination of filtering (differential and common mode), to attenuate conducted emissions and screening to attenuate radiated emissions, as illustrated in FIG. 19b. The purpose of adding filters is to block the noise propagation (high impedance at high frequency for inductors) and to bypass the noise (low impedance at high frequency for capacitors). Typically, such features are added at converter and system level rather than being integrated into the switching cell.

As described above at frequencies below several MHz, conventional, passive EMI filters typically provide enough noise attenuation, however, at higher frequencies, filter performance is compromised by parasitic inductance and capacitance within the filter system and by mutual electromagnetic coupling between filter stages. In addition, the bypass route for high frequency noise back to its noise source might not be effective due to the parasitic impedance in the noise-current return path. Therefore, the realisation of broadband noise filters becomes challenging with conventional filter configurations.

Figure 19C:
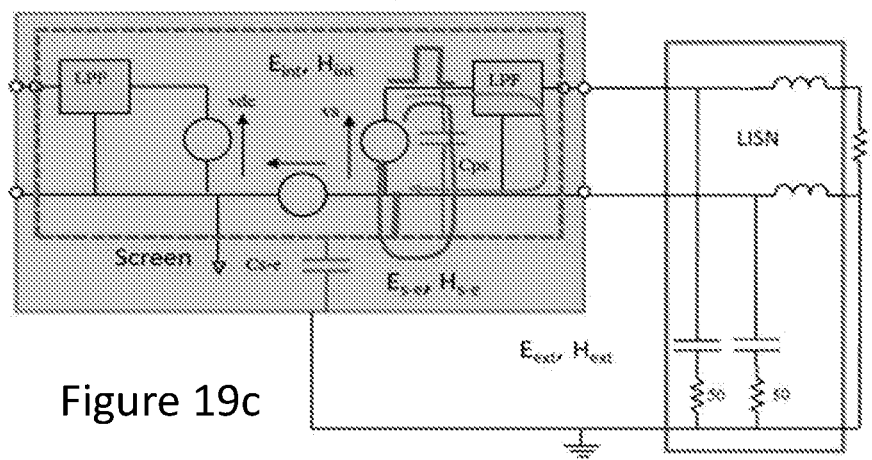

In contrast to the conventional approach of tackling EMI by applying passive filters to attenuate noise outside the switching cell, the present invention proposes an alternative approach to solve EMI problems within the switching cell, illustrated in FIG. 19c. By applying partial or complete conductive partitions or by embedding an electrically conductive screen layer, internally generated switching noise may be returned to the source. Common mode noise which would otherwise be capacitively-coupled to ground is returned direct to the screen. Internally generated magnetic fields are attenuated in the screen layer or in additional shielding layers whose thickness and extent are chosen to produce the desired degree of attenuation. In addition to screening and shielding techniques, a differential mode filter, which features a very broad stop band and significant level of noise attenuation is required for EMI suppression purposes.

In the context of this invention, a switching cell can be exemplified as a noise source, where the switching cell comprises one or more switching elements, typically semiconductors and passive components (inductors, capacitors) that are operated to transfer electrical energy between two (or more) electrical ports.

The basic elements of the switching cell are combined with gate drives, sensors and associated control elements to define its function.

A well-known example of a switching cell is a half bridge 160, illustrated schematically in FIGS. 20a and 20b, which can be used as a building block for dc-dc converters and inverters. Two semiconductor switches 162 are connected in series between across the power source. One or multiple decoupling capacitors 164 are mounted as close as possible to the switches 162 to form a low impedance commutation loop. The voltage alternates between according to the state of the switches 162 (either on or off) while the current flowing in or out alternates between the two switches 162. This switching action generates transient voltages and currents or, in a more general sense, transient electromagnetic fields which emanate from the switching cell 160. The decoupling capacitor 164 supports the switching action by providing a source of energy for the transient electromagnetic fields generated as a result of the switching action. The combination of measures described in this invention provide a means to ensure that the electromagnetic fields generated as a result of the switching action remain confined within a defined volume or enclosure. The energy associated with the fields is either returned to the switching cell 160 or absorbed within the enclosure.

To illustrate the effectiveness of the various techniques described in the invention, a GaN (Gallium Nitride) half-bridge power module is employed, configured as a step-down or buck converter, as a source of switching noise. FIG. 21a shows an outline schematic of the experimental arrangement, including switching cell 160, DC power source 166, LISN (Line Impedance Stabilization Network) 168, and load 170. Differential Mode (DM) noise, indicated by lines 172 is circulated between the DC-link 166 and switching stage/LISM (160/168) at the input side and between the load 170 and switching stage 160 at the output side. Coupled Common Mode (CM) noise is circulated between the converter system and the ground 174, indicated by line 176.

In the experimental setup, the GaN device is switched at a frequency of around 1.1 MHz with a dc input voltage of 100V and output current of 3.1 A. Voltage rise and fall times of 15 ns and 3 ns respectively ensure that a broad spectrum of EM noise is generated, extending from the switching frequency to over 100 MHz. Typical switching voltage waveforms are shown in FIG. 21b. RF current probes, with a bandwidth of 200 MHz, are used to measure CM and DM noise at both input and output, whilst a near field probe is used for radiated noise measurement. In FIG. 21b $V_{ds}$ is the drain-to-source voltage and is indicated by line 178, and $V_{gs}$ is the gate-to-source voltage, and is indicated by line 180.

Figure 22A:
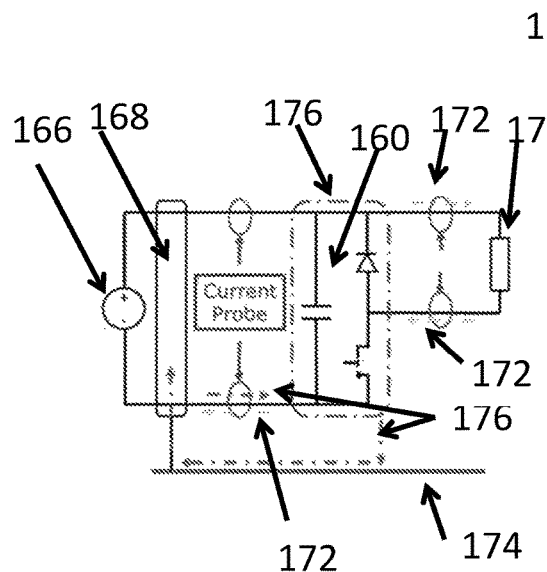
FIGS. 22a and 22b shows a schematic of the instrumentation and an image of the experimental set-up.
Figure 22B:
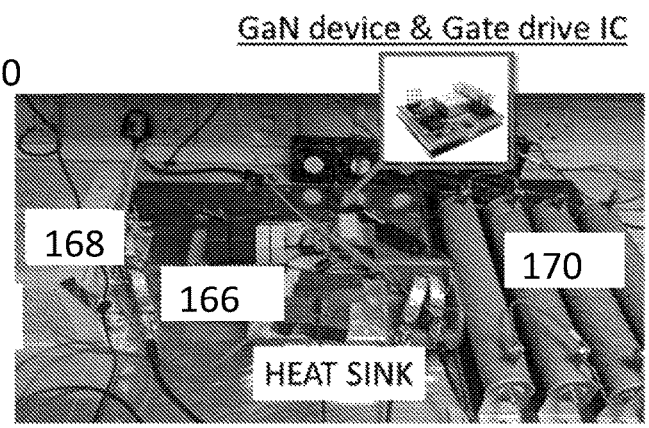

A schematic of the instrumentation and an image of the experimental set-up are shown in FIGS. 22a and 22b. The effectiveness of the range of interventions described in the patent were determined by comparing the DM, CM and radiated noise spectra over a frequency range from 1 MHz to 200 MHz using a spectrum analyser.

From the initial EMI measurement results of FIG. 23, a high level of noise is visible in both conducted and radiated measurements. The first noise peak is at the 1.1 MHz switching frequency with its harmonics and high frequency noise showing a significant level up to at least 200 MHz (limited by the current probe bandwidth). The input CM and output DM results show a conducted noise level of more than 100 dB compared to background noise (noise floor).

Figure 24:
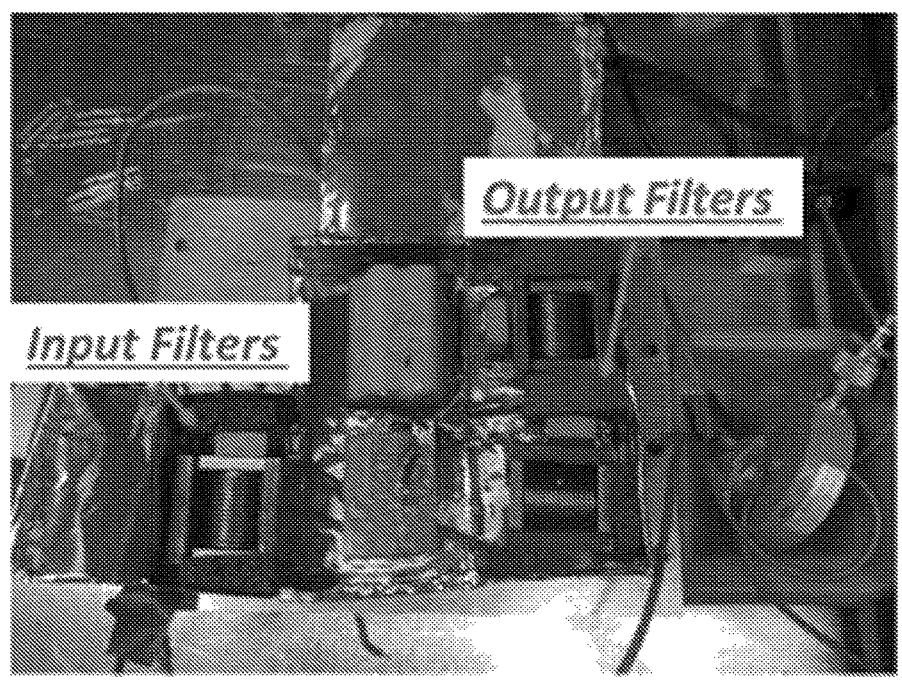
FIG. 24 shows an applied filter assembly.

The first intervention is to add single- or multi-stage low pass filters to attenuate noise at both the output and input of the converter. FIG. 24 shows the applied filter assembly comprising a single-stage low pass filter at the input and a two-stage low pass filter at output. A conductive (copper) shield layer 104 is used to confine and attenuate radiated noise and to return coupled electric flux (charge) back to the switching cell. The filter used at the input side combines a 100 µH inductor and 1 nF capacitor to provide more than −70dB noise attenuation from 1 MHz to 10 MHz. An identical filter is applied at the output side combined with a second-stage low pass filter which includes 10 µH inductor and 0.1 µF capacitor to extend the stop band to higher frequencies. The 2-stage filter on the output side reflects the need to attenuate much higher levels of HF noise (rail-to-rail voltage transitions) when compared to the input side (relatively low-level voltage ripple).

Figure 25:
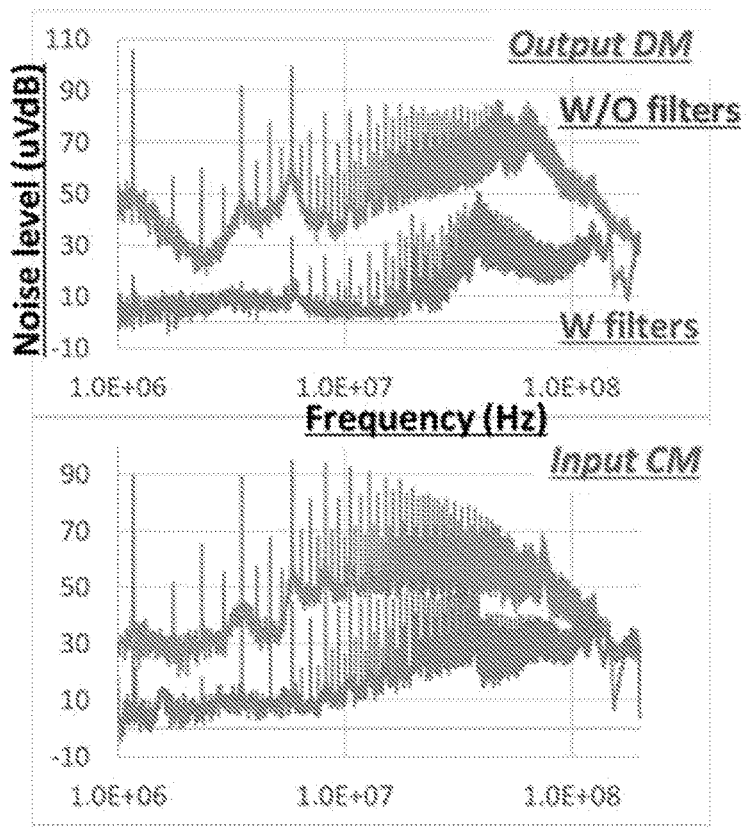
FIG. 25 shows the EMI measurements from filter assembly shown in FIG. 24.

From EMI measurement results shown in FIG. 25, the combined input and output filters can achieve about 70 dB suppression of input CM and 80dB suppression of output DM at the switching frequency 1.1 MHz the lower frequency switching harmonics. However, it has more limited impact at frequencies above 10MHz due to parasitics within the filter stages and unintended EM field coupling. This result aligns with previous simulation and measurement of standalone filter components.

Figure 26:
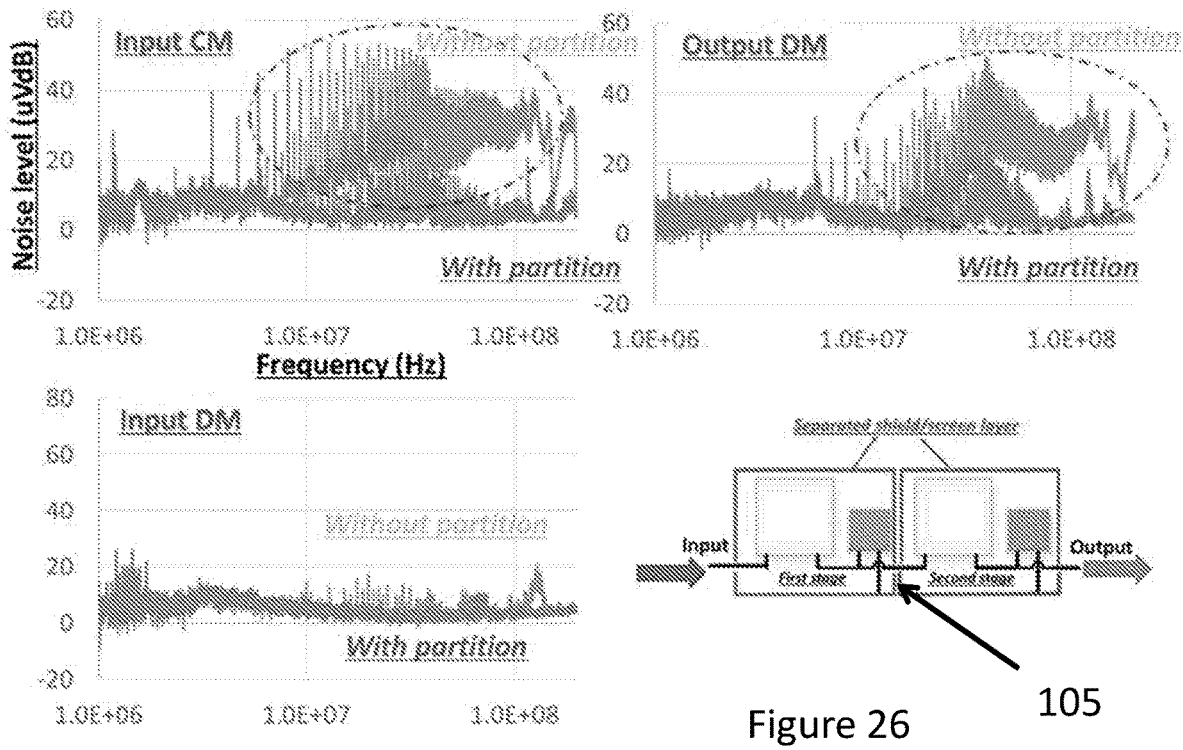
FIG. 26 shows EMI measurements with and without partition layers.

To meet the requirements for higher attenuation at higher frequencies, closed conducting partitions are needed to ensure effective EM field decoupling between filter stages. In contrast to the partial partitions 70 shown in FIG. 3b, closed partition containment can stop EM coupling between individually screened regions. FIG. 26 compares the EMI attenuation results with and without a closed partition layout. The closed partition arrangement can achieve a 30 dB improvement in conducted noise attenuation at frequencies from 10 MHz to 50 MHz. This level of additional noise attenuation aligns closely with the previous result obtained from the VNA frequency response (FIG. 4) and proves that a closed partition containment can limit EM coupling from the noise source to the external environment. However, as discussed above, the gaps/slots 105 between partition layers 101 and power traces 152 still allow high frequency EM fields to pass through, compromising the overall filtering performance. This leaked EM field propagates along the power traces 152 and eventually reaches the external environment. Evidence of this effect can be seen in FIG. 26 for frequencies in excess of 20 MHz.

To overcome the limitations of a simple closed partition, integrated capacitors 154 are used to fill the gaps and block EM field propagation. This forms a filtered feedthrough connection. Capacitors 154 should be integrated around the power trace(s) 152 to realise a continuous EM-field blocking configuration in combination with the partition/shield layers 101, 104. In this experimental setup, capacitors 154 are integrated around the power trace 152 as shown in FIGS. 27a and 27b. On the output/load side 170, the capacitors are connected to the screen or partition layer and kapton tape is used to provide electrical isolation between capacitors 154 and the power trace. On the input/source 166 side, all capacitors 154 are electrically connected to the power trace 152, such as by soldering. FIG. 27 shows how integrated capacitors 154—power trace 152 arrangement is connected to partition/shield layer 101, 104. Note that the aperture in the screen/partition 101, 104 that carries the power trace 152 should have the minimum possible gap around the trace to minimise EM leakage whilst respecting electrical isolation requirements.

FIG. 28 shows the connection of capacitors 154 with partition/shield 101, 104 layer between 1st and 2nd stage filters. On the right side is the first stage (high cut-off frequency) low-pass filter which is connected to the output power trace 152 of GaN half bridge, and on the left side is the 2nd stage filter (low cut-off frequency) which is connected to the load (external terminals). Low pass filter components are used to attenuate and return unwanted low frequency noise and the combination of partition/shield layer 101, 104 and integrated capacitors 154 is used to return high frequency noise and reflect EM fields. The inter-stage partition with integrated capacitors 154 helps to confine HF conducted noise and EM fields within the 1st filter section.

FIG. 29 shows a complete arrangement including capacitors 154 and partition/shield layers 101, 104. The basic layout of GaN switching cell, gate drive power supply, input and output filters remains the same as the layout of FIG. 24 but with the addition of partition layers 101. Partition layers 101 are added between the input filter and the switching stage and between the output filters and switching stage. A further partition layer 101 is inserted between 1st stage and 2nd stage of the output filter. These internal partition layers 101 are effective at decoupling high frequency EM fields between individual screened compartments. Where the power traces 152 pass through external shield layers 104 and partitions, integrated capacitors 154 (at 6 positions, indicated by dotted lines in FIG. 29) are used to return high frequency noise and block EM field leakage between the partition/shield layer and the power trace. FIG. 30 shows the finished GaN power converter with all EMI interventions applied. Note that the top shield layer (missing in FIG. 29) is connected to the remainder of the external shield layer 104 by an electrically conductive joining process. Similarly, the top of the partition layers 101 are electrically connected to the top shield layer to provide a continuous shielding configuration. Details of the input and output terminals, where the insulated power traces pass through the external shield layer 104, are shown on the right of FIG. 30.

FIG. 31 shows a functional schematic diagram of the finished GaN converter. Regions 182, 184 and 186 indicate the relative intensity of high frequency EM interference, from high (region 186) level to low (regions 182) level. With the partition/shield layers 101, 104 and integrated capacitors 154, HF EM interference is confined and contained within the compartment where the GaN switching cell is located. When the power trace 152 passes through an EM-field containment barrier (partition or external shield), the EM noise level is reduced. The closed and continuous external shield layer contains all HF EM fields within this converter whilst allowing DC and low-frequency power to pass freely.

FIG. 32 compares the results obtained from the converter with all EMI interventions applied and the background noise level. Both the conducted and radiated noise components are reduced close to or below the background noise level. These results align closely with the previous frequency response result of proposed broadband filter (see for example FIG. 18) and demonstrate that more than 100 dB of noise attenuation is possible across a 3-decade frequency range.

FIG. 33 provides a schematic of an alternative approach for providing the broadband filter according to an embodiment of the present disclosure. In this approach the broadband filter is derived from more conventional power electronic module packaging and broadly comprises an assembly of multiple substrates, which are stacked together to form a complete converter. This is a converter in package approach.

Typically, power dies 214 are mounted onto a ceramic-based substrate 210 (e.g. DBC, DBA), along with a limited number of passive components (such as resistors and the like). Die interconnects between substrate layers are either wire bonded or created by planar overlays. Additional function layers, for example containing gate drives, decoupling capacitors and control circuitry are then created, typically using standard PCB assembly processes. The individual boards are then stacked together with solder pins or spring contacts making the electrical interconnections. A typical build-up is shown in FIG. 33. In this example the power devices are SiC JFETs mounted onto a DBC substrate in a cascode configuration with Si MOSFETs. The inductor winding is mounted onto the same DBC substrate for enhanced cooling so a high current density, in excess of 50 A/mm2, can be utilized to keep the inductor volume to a minimum. Water cooling may be used to maintain ideal operating temperatures of the switching device.

It can be seen that the PCB substrate approach allows for a degree of modularity with components built up onto a PCB using known PCB manufacturing techniques. Additionally it is possible to embed the power dies within the PCB to create a compact functional switching cell and then add further control functions on separate substrates. This can help to avoid some of the yield issues and reliability issues associated with complex multi-layer build-up laminates, in particular those associated with the high through-thickness coefficient of thermal expansion (CTE) of typical epoxy-based systems.

FIG. 34g shows an alternative embodiment of a converter in package solution, such as that of FIG. 33 in greater detail. In particular, a broadband filter 300 in which one or more substrates are bonded to a PCB panel are shown. In particular, power signal source dies 302, such as a power switching device like a MOSFET, HEMT or the like are attached to one or more substrates, preferably using sintering or high-temperature solder to avoid re-melt during later operations. Conducting interconnect posts are then added where needed. Laminate can then be applied with pre-cut pockets for dies, interconnect posts and other components which are to be bonded to the thermally conducting substrates e.g. "wound" components, current shunts. Inserts (typically PTFE) are added in unfilled pockets and the surface planarized.

From the planarized surface, layers of dielectric and patterned copper layers 304 are disposed on top of the surface with varying thicknesses, to provide power planes, gate drive tracking, filter components, signal & sensing, power termination pins. Vias between layers are used as needed.

The process for manufacturing the converter in package solution of FIG. 34g is shown in more detail in FIGS. 34a-34g, with FIGS. 34a-34f showing comparative cross-sectional and top-down views (z axis exaggerated in cross-sectional view). FIG. 34a shows a FR4 or similar panel 301 having a number of defined modules 301a, each module 301a with apertures 301b for a number of multi-layer, thermally conducting substrates 334 (IMS or ceramic DBC/AMB). Substrates 334a are typically edge-bonded into panel 301 then Cu foil/plating applied to connect to mid layer. A mid layer 334a preferably extends to the edge of, or slightly beyond, the ceramic panel 301. An alternative approach may use two DBC/AMB substrates "stacked". In this case the first substrate is edge bonded into the panel then Cu foil/plating applied to connect to top Cu of first substrate. The second substrate is then bonded (sintered, soldered etc.) to first substrate. The end result has substrate "islands" 301b with top Cu layers exposed in a "sea" of Cu metallisation, which will become part of the continuous "screen". The build-up may also start with a heat spreader plate or integrated cooler depending on intended cooling application.

Once the thermal connections are produced, Power device dies 302 can be attached to one or more of the 334a substrates as shown in FIG. 34b, preferably using sintering or high-temperature solder to avoid re-melt during later operations. Conducting interconnect posts may also be added where needed Laminate can then be applied with pre-cut pockets for dies, interconnect posts and other components which are to be bonded to the thermally conducting substrates e.g. "wound" components, and current shunts Inserts (typically PTFE) added in unfilled pockets. Finally, the surface can be planarized to generate build-up 334b. Note that the substrate islands 301b are not covered.

FIG. 34c shows a multi-layer build up process from the planarized surface. In particular, the die dielectric build-up 334a and Cu overlayers 304 are added. The dies are interconnected via holes over die pads, leaving the substrate island 301b and holes 302a to the device dies 302 via plating, patterning and etching techniques (which are known in the art). Further dielectric and patterned Cu layers of varying thicknesses can be added according to function e.g. power planes, gate drive tracking, filter components, signal and sensing, power termination pins. Vias between layers can also be added as needed.

FIG. 34d shows the addition of the surface mount components. In particular, control board connectors 308 and inductors 120 and the like can then be added. Power connecting pins 330 act as electrical conductors to provide electrical connection to the electrical signal source 302. The active and passive components are typically added by reflow soldering, sintering or similar. Inductors 120 are added to sit on the substrate islands 301b. The power terminating pins 330 and control board connectors 308 are then added.

The control board 310 can then be pre-assembled and mounted onto the substrate, as shown in FIG. 34e. Filtered feedthrough connections on the PCB are provided by a plurality of the capacitors 152 encapsulating the pins 330 (i.e. the interconnecting conductor) in the manner described above, which are shown in FIG. 34g.

Once the control board is mounted, the sidewall frame 320 can be mounted to the substrate and the active and passive components, inductors 120 and control board 310 are encapsulated using silicone gel 333 or the like (such as hard rubber). The inductors and control board electronic components 308 may have partition layers or the like as described above (i.e. they may have separate encapsulation). The sidewall frame 320 acts as a dam for the encapsulation and to provide EM noise suppression as described in detail above. This is shown in FIG. 34f. Additionally, as part of this encapsulation process slots are milled to expose the top of the screen layer (lip). A final cut through to singularise module can then be made. It should be noted that the terminating pins need to stand proud of the encapsulation.

Next, a multi-layer laminate (e.g. PCB) lid 326 with filtered feedthrough connections is added to the substrate. The filtered feedthrough connections are also provided in the lid 326. in the manner described above. This lid 326 provides a shield over the active and passive filter components. A side-wall foil completes screen by wrapping over sides of box and bonding to top of lid or alternatively butted up against lip formed by top layers of lid 326. The lid 326 feedthrough connections 330 further comprise a labyrinthine feedthrough path 332 shown in greater detail in FIG. 35.

FIG. 35 shows a cross-sectional view of the labyrinthine feedthrough 332 shown in FIG. 34g. In particular a bus bar feedthrough connector 330 or terminating pin provides an electrical conducting bar or path. Interleaved conductors 344 arranged in an overlapping arrangement provide a labyrinthine conducting path around each pin 330 to act to attenuate HF EM fields. Additionally, conductive inserts 340 and/or side-wall of the conductive shield connects to ground planes to form a continuous shield to complete the labyrinth around each group of pins/bus bar 330. Top layers of lid 326 provide a base for retaining the inserts 340. Accordingly, each conductor is surrounded on inner surface by capacitors connected between conductor and inner ground plane to reflect/attenuate HF EM fields.

A further embodiment of encapsulation of control components, in this case and inductor 120 is shown in FIGS. 36a and b. In these figures, a schematic representation of a linked inductor 120 is shown. In this embodiment, the inductor 120 is fabricated with one or more single-layer windings 430 which are directly attached (soldered, sintered) to traces on a thermally conducting substrate e.g. IMS, ceramic. Greatly reduced thermal resistance permits increased current densities (up to 100 A/mm2) and reduced overall component volume.

Confinement and guiding of magnetic flux is achieved through use of magnetic core elements 440 and conducting shields 450 (thickness >skin depth at ripple/switching frequency). In multiple winding arrangements, the degree of coupling can be controlled by correct sizing and positioning of cores and shields (both inter-winding and external). Shields 450 are typically connected to fixed potential (e.g. DC−, DC+). In this case, each inductor component is separated by a partition layer 455 that acts to control the degree of electromagnetic coupling between the inductor components.

Copper shield 450 is typically ~0.2 mm thick to the top and sides, with the base open to allow thermal & electrical connection to substrate islands 301b. Traces 430 on the substrate provide the lead-out connections and complete the shield under the magnetic path of the magnetic core elements 440.

Rectangular or round wire may be used for winding 430. If round then the bottom surface is usually polished flat to bond to traces on the substrate 301b. Not all turns need to be connected to the substrate, e.g. alternate conductors may be bonded to ease alignment & mount-down. Galvanically-isolated windings may also be surrounded by individual screens, (connected to a fixed potential in each isolated partition) to minimise capacitive coupling effects. It can be appreciated that the winding 430 utilised in this embodiment can be applied to the embodiment described previously.

From reading the present disclosure, other variations and modifications will be apparent to the skilled person. Such variations and modifications may involve equivalent and other features which are already known in the art of EM noise suppression and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims

The invention claimed is:

1. A broadband filter for confining or attenuating electromagnetic interference noise from one or more electrical signal sources, said broadband filter comprising:
    one or more filter stages electrically coupled by galvanic or by electromagnetic means to the one or more electrical signal sources for confining or attenuating conducted electromagnetic interference noise;
    one or more conductive shields electrically coupled by galvanic or by electromagnetic means to the one or more electrical signal sources, wherein the one or more conductive shields encapsulate the one or more filter stages for confining or attenuating conducted and/or radiated electromagnetic interference noise; and
    one or more conductive partition layers to encapsulate the one or more filter stages such that the partition layers electromagnetically couple adjacent filter stages for a selected frequency range of the electromagnetic interference noise, wherein a thickness of the conductive partition layers is chosen to control a degree of coupling;
    wherein the one or more filter stages further comprise filter components and one or more additional conductive partition layers placed between and/or around the one or more filter components to electromagnetically couple said filter components for a selected frequency range of electromagnetic interference noise.

2. The broadband filter of claim 1 wherein the one or more conductive shields and the conductive partition layers are electromagnetically coupled partly or substantially through an air-cored configuration.

3. The broadband filter of claim 1 wherein a higher-frequency filter stage is encapsulated within a lower-frequency filter stage.

4. The broadband filter of claim 1 wherein:
    the thickness of the conductive partition layers is progressively increased the further away the conductive partition layers are from the one or more electrical signal sources, such that the conductive partition layer attenuating or reflecting electromagnetic interference noise with the highest frequency is located closest to the one or more electrical signal sources.

5. The broadband filter of claim 1, wherein each filter stage has a different cut-off frequency for confining or attenuating the conducted electromagnetic interference noise at a cut-off frequency thereof.

6. The broadband filter of claim 1, wherein an anti-resonant frequency of a filter stage having a lower cut-off frequency is substantially aligned with a resonant frequency of an adjacent filter stage with a higher cut-off frequency.

7. The broadband filter of claim 1, wherein a thickness of the one or more conductive shields are such that they prevent propagation of electromagnetic interference noise corresponding to the filter stage with the lowest cut-off frequency.

8. The broadband filter of claim 1, wherein one or more of the one or more filter stages form an in-line filter for suppressing electromagnetic interference noise from the one or more external electrical signal sources.

9. The broadband filter of claim 1, wherein the one or more filter stages are electrically connected by an interconnecting conductor for carrying electrical signals through the one or more filter stages for a specific range of frequencies; and wherein an insulating layer between the interconnecting conductor and the one or more conductive shields electrically isolates the interconnecting conductor from the one or more conductive shields to avoid insulation breakdown and partial discharge.

10. The broadband filter of claim 9, wherein the one or more conductive shields and/or the conductive partitions layers comprise one or more apertures to allow electrical signals to pass through the shield and/or partition layers.

11. The broadband filter of claim 10, wherein one or more capacitors are deployed adjacent to the one or more apertures to substantially cover the one or more apertures and prevent propagation of electromagnetic interference noise through the one or more apertures; and wherein the one or more capacitors are located within the one or more conductive shields and/or conductive partition layers that encapsulate a filter stage such that the one or more capacitors form part of a capacitance of the filter stage; and the conductive partition layers and/or shield layers are electrically connected to a second terminal of each of the one or more capacitors; and wherein the first terminal of each of the one or more capacitors is electrically isolated from the partition layers and/or shield layers, and the second terminal of each of the one or more capacitors is electrically isolated from the interconnecting conductor.

12. The broadband filter of claim 11, wherein:
    the one or more capacitors contain multiple layers of metal, and further comprise metal end caps, such that incident electromagnetic interference noise is reflected back into the one or more filter stages.

13. The broadband filter of claim 11, wherein the interconnecting conductor for carrying electrical signals through the one or more filter stages is encapsulated by a plurality of the one or more capacitors, such that a filtered feedthrough connection is created.

14. The broadband filter of claim 13, wherein the plurality of the one or more capacitors provide the filtered feedthrough connection through a printed circuit board; and wherein the printed circuit board is integrated as part of a power converter.

15. The broadband filter of claim 1, wherein the conductive partition layers and/or the one or more conductive shields are thermally managed to dissipate heat generated to allow increased current density.

16. The broadband filter of claim 1, wherein the conductive partition layers and/or the one or more conductive shields direct and confine electromagnetic interference noise back to and local to the one or more electrical signal sources, away from an output signal of the one or more electrical signal sources.

17. The broadband filter of claim 1 wherein the one or more conductive shields and the conductive partition layers are electrically connected by using vias, or via metallic pillars, or by direct soldering of the one or more conductive shields and the conductive partition layers, such that the combination of partitions and one or more conductive shields encapsulate each filter stage.

18. The broadband filter of claim 1, wherein the conductive partition layers and/or the one or more conductive shields comprise a magnetic material for magnetically coupling the electromagnetic interference noise.

19. A broadband filter for confining or attenuating electromagnetic interference noise from one or more electrical signal sources, said broadband filter comprising:
    one or more filter stages electrically coupled by galvanic or by electromagnetic means to the one or more electrical signal sources for confining or attenuating conducted electromagnetic interference noise;

one or more conductive shields electrically coupled by galvanic or by electromagnetic means to the one or more electrical signal sources, wherein the one or more conductive shields encapsulate the one or more filter stages for confining or attenuating conducted and/or radiated electromagnetic interference noise; and one or more conductive partition layers to encapsulate the one or more filter stages such that the partition layers electromagnetically couple adjacent filter stages for a selected frequency range of the electromagnetic interference noise, wherein a thickness of the conductive partition layers is chosen to control a degree of coupling;

wherein each filter stage has a different cut-off frequency for confining or attenuating the conducted electromagnetic interference noise at a cut-off frequency thereof.

20. A broadband filter for confining or attenuating electromagnetic interference noise from one or more electrical signal sources, said broadband filter comprising:

one or more filter stages electrically coupled by galvanic or by electromagnetic means to the one or more electrical signal sources for confining or attenuating conducted electromagnetic interference noise;

one or more conductive shields electrically coupled by galvanic or by electromagnetic means to the one or more electrical signal sources, wherein the one or more conductive shields encapsulate the one or more filter stages for confining or attenuating conducted and/or radiated electromagnetic interference noise; and one or more conductive partition layers to encapsulate the one or more filter stages such that the partition layers electromagnetically couple adjacent filter stages for a selected frequency range of the electromagnetic interference noise, wherein a thickness of the conductive partition layers is chosen to control a degree of coupling;

wherein the conductive partition layers and/or the one or more conductive shields comprise a magnetic material for magnetically coupling the electromagnetic interference noise.

* * * * *